United States Patent [19]
Korenaga et al.

[11] Patent Number: 5,467,720
[45] Date of Patent: Nov. 21, 1995

[54] SUPPORT DEVICE

[75] Inventors: Nobushige Korenaga, Sagamihara; Kazunori Iwamoto, Yokohama, both of Japan

[73] Assignee: Canon Kabushiki Kaisha, Tokyo, Japan

[21] Appl. No.: 328,390

[22] Filed: Oct. 24, 1994

Related U.S. Application Data

[63] Continuation of Ser. No. 840,555, Feb. 25, 1992, abandoned.

[30] Foreign Application Priority Data

Feb. 25, 1991 [JP] Japan ..................... 2-050102

[51] Int. Cl.$^6$ ................................. A47B 85/00
[52] U.S. Cl. .................... 108/20; 108/147; 248/566
[58] Field of Search ................. 108/20, 142, 143, 108/147, 137; 248/565, 506, 610; 74/479

[56] References Cited

U.S. PATENT DOCUMENTS

| | | | |
|---|---|---|---|
| 4,489,991 | 12/1984 | Delam . | |
| 5,228,358 | 7/1993 | Sakino et al. | 108/20 |
| 5,338,358 | 7/1993 | Sakino | 108/20 |

FOREIGN PATENT DOCUMENTS

| | | |
|---|---|---|
| 0263569 | 1/1989 | German Dem. Rep. . |
| 3437835 | 5/1985 | Germany . |
| 3200815 | 2/1987 | Germany . |
| 3725497 | 2/1989 | Germany . |
| 2100311 | 4/1990 | Japan . |
| 2148953 | 6/1985 | United Kingdom . |

*Primary Examiner*—Kenneth J. Dorner
*Assistant Examiner*—Gerald A. Anderson
*Attorney, Agent, or Firm*—Fitzpatrick, Cella, Harper & Scinto

[57] ABSTRACT

A supporting device for supporting a member having an inside movable portion includes a main frame, a supporting reference plate on which the member is to be placed and a plurality of driving mechanisms each being disposed between the main frame and the supporting reference plate and each having a high-rigidity displacement providing element and a low-rigidity supporting element of low damping factor, disposed in series.

14 Claims, 17 Drawing Sheets

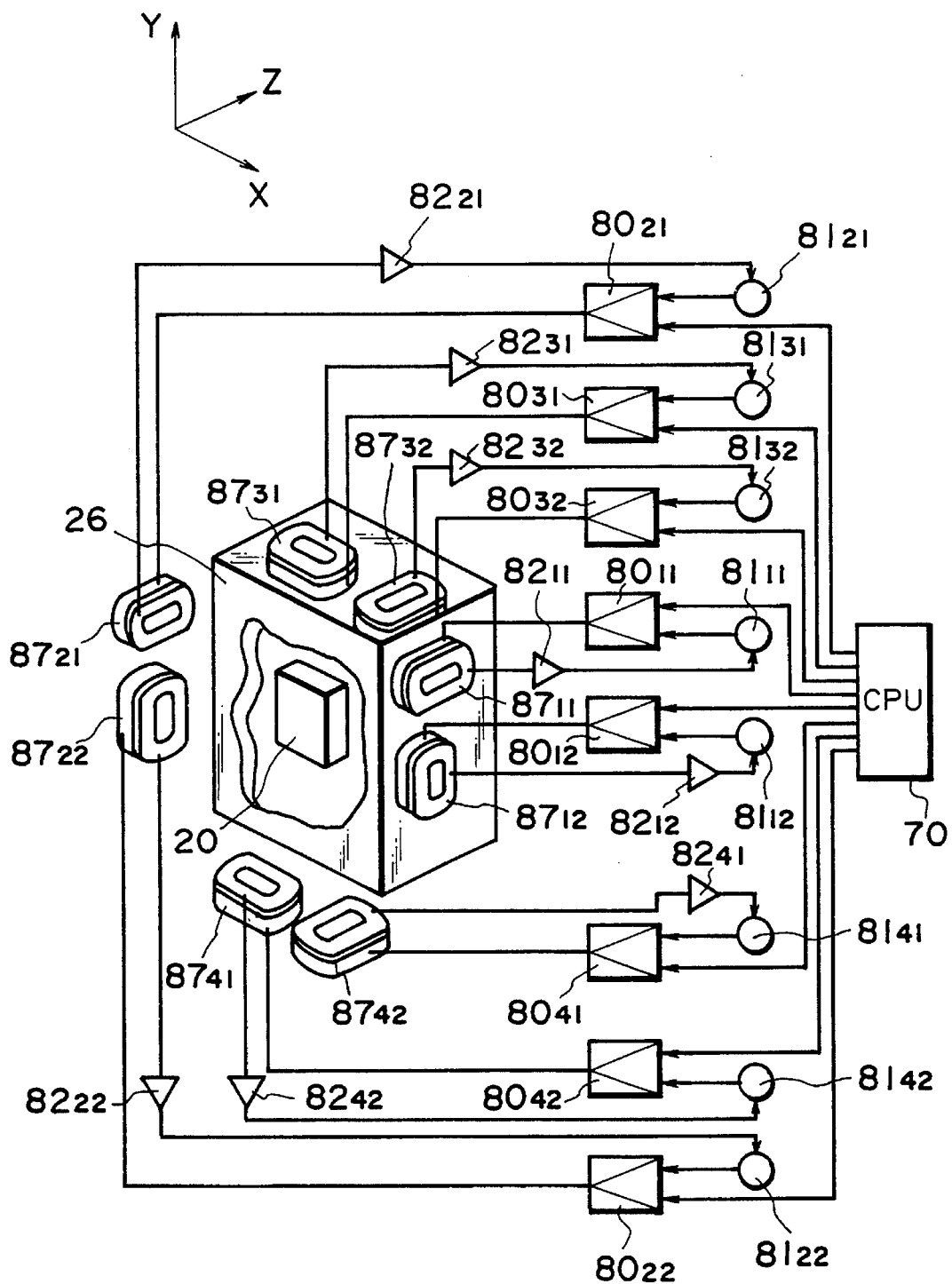
F I G. 10

SUPPORT DEVICE

This application is a continuation of prior application, Ser. No. 07/840,555 filed Feb. 25, 1992, now abandoned.

FIELD OF THE INVENTION AND RELATED ART

This invention relates to a supporting device and, more particularly, to a supporting device suitably usable in an X-ray exposure apparatus, for example, used with a light source such as synchrotron radiation light, wherein a light source and an exposure apparatus are disposed with respect to different positional references.

Increasing capacity in a semiconductor memory has forced improvements in fine patterning techniques in semiconductor device manufacturing apparatuses.

One measure for an improvement in the fine patterning technique is an X-ray exposure apparatus used with a light source of synchrotron radiation light (Japanese Laid-Open Patent Application Laid-Open No. b 2-100311). However, in such an X-ray exposure apparatus, an electron accumulating ring which is a source of synchrotron radiation light is disposed with respect to a positional reference different from that of the exposure apparatus and, therefore, use of an attitude control device for maintaining constant attitude of the exposure apparatus is necessary to hold the positional relationship between the electron accumulating ring and the exposure apparatus.

FIGS. 21A and 21B are schematic views of a known example of an attitude control device for an X-ray exposure apparatus.

This attitude control device includes a vacuum chamber 101 having accommodated therein a wafer stage (movable portion) 102 which is moved along an X-axis rail 115 and a Y-axis rail 116 by means of an actuator means, not shown. The vacuum chamber 101 is floatingly supported by first, second and third air springs $108_1$, $108_2$ and $108_3$ on a main frame 114. By supplying air from first, second and third pumps $112_1$, $112_2$ and $112_3$ (the third pump $112_3$ is not shown) to the air springs $108_1$, $108_2$ and $108_3$, respectively, in accordance with the tilt of the vacuum chamber 101, the attitude of the vacuum chamber 101 can be held constant.

More specifically, the vacuum chamber 101 is connected to a supporting reference plate 103 through two supporting rods $104_1$ and $104_2$ extending through a top plate of the main frame 114, and the vacuum chamber is supported between the top plate of the main frame 114 and the supporting reference plate 103, by means of the air springs $108_1$, $108_2$ and $108_3$ located at left and right positions on the rearward side and at a center position on the forward side, respectively, as viewed in FIG. 21B. Also, for detection of displacement in the Y-axis direction of the top plate of the supporting reference plate 103 on which the air springs $108_1$–$108_3$ are mounted, there are provided first, second and third displacement sensors $118_1$, $118_2$ and $118_3$ which are mounted on first, second and third displacement detection reference plates $106_1$, $106_2$ and $106_3$, respectively, so as to contact the top surface of the supporting reference plate 103. The first to third displacement detection reference plates are mounted on the top plate of the main frame 114. Further, to the air springs $108_1$–$108_3$, there are provided first, second and third piping means $113_1$, $113_2$ and $113_3$ (the third piping means $113_3$ is not shown) each for coupling an associated one of the air springs $108_1$–$108_3$ to a corresponding one of the pumps $112_1$–$112_3$. First, second and third valves $111_1$, $111_2$ and $111_3$ each is interposed in a corresponding one of the piping means $113_1$–$113_3$ and it is controlled in response to an output signal from a corresponding one of the displacement sensors $118_1$–$118_3$.

SUMMARY OF THE INVENTION

However, this type of attitude control device involves a first problem peculiar to a driving system and resulting from negative feedback of a positional deviation of the vacuum chamber 101 to the opening of the three valves $111_1$–$111_3$ and a second problem concerning the system as a whole and resulting from control of the attitude of the vacuum chamber by the three air springs $108_1$–$108_3$. Details of these two problems will be explained, below:

(a) The problem peculiar to the driving system:

For simplicity, a case wherein as shown in FIG. 22 a member 120 having a mass "m" is supported by an air spring 121 with a sectional area "S" and a height "h", is considered.

If the pressure and volume of the air spring 120 and the mole number of the air are denoted by Pn, Vn and Nn, respectively, and if a pressure change and a volume change of the air spring when vibrated and a change in mole number of the air are denoted by p, v and n, respectively, and further if the displacement of the supported member 120 is denoted by x, then an equation of motion and an equation of state such as follows are obtained:

$$m \cdot d^2x/dt^2 = p \cdot S \tag{1}$$

$$(Pn+p)(Vn+v) = (Nn+n) \cdot k \cdot T \tag{2}$$

Also, if the atmospheric pressure is denoted by $P_0$ and the flow rate of the air at a pressure of $P_0$ is denoted by Q, then a continuous equation such as follows is obtained:

$$P_0 \cdot Q = k \cdot T \cdot (dn/dt) \tag{3}$$

wherein $$dv/dt = (Vn/h) \cdot (dx/dt) \tag{4}$$

Therefore, by simplifying equation (2) while disregarding the minute term of p·v, the following equation is obtained:

$$(d^3x/dt^3) + \{(Pn \cdot S)/(m \cdot h)\} \cdot (dx/dt) = (P_0 \cdot S \cdot Q)/(m \cdot h) \tag{5}$$

Therefore, with the negative feedback of the displacement x of the supported member 120 to a valve (not shown) of the air spring 120, the flow rate Q of the air of the pressure $P_0$, which can be approximated as follows, results:

$$Q = kT \tag{6}$$

An equation obtainable by substituting equation (6) into equation (5) is one with a third story with respect to the displacement x but, since it has no second story with respect to the displacement x, it necessarily has an unstable pole.

Also, while actually the air spring 121 itself has a small damping resistance, the quantity c/m is so small relative to the damping coefficient that it has substantially no effect. The oscillation may occur or, alternatively, vibration damping time may become longer.

If the damping coefficient c is made larger for quick damping, it causes a high possibility of each transmission of vibration of high frequency during the exposure operation, and the intended effect of vibration insulation is not attainable.

(b) The problem concerning the system as a whole:

An approximated structure of the whole system of the attitude control device shown in FIG. 21A may be such as illustrated in FIG. 23. More specifically, the vacuum chamber on which the wafer stage 102 is mounted is supported by the first to third air springs $108_1$–$108_3$ through the two supporting rods $104_1$ and $104_2$ and the supporting reference plate 103.

Here, the first air spring $108_1$ is connected to the supporting reference plate 103 by means of a universal joint $202_1$, through a spring element $200_1$ in the X-axis direction in the drawing as well as a spring element $201_1$. This is also true with the case of the second air spring $108_2$ and the third air spring $108_3$.

When the wafer stage 102 is accelerated, due to its reaction force and reaction moment, each of the spring elements $200_1$–$200_3$ and $201_1$–$201_3$ of low rigidity receives a large displacement. Since however what can be controlled with the driving system is only the displacement component in the Y-axis direction in the drawing, as regards the displacement components in the X-axis and Z-axis directions there is no way other than waiting for extinction by natural attenuation. Here, if the attenuation is made large, then a problem of failure of vibration insulation results.

Further, when static balance is considered, movement of the wafer stage destroys the balance of moment, and each of the spring elements $200_1$–$200_3$ and $201_1$–$201_3$ receives a large displacement. The control of a displacement component in the Y-axis direction and of the angle of rotation about the X-axis or Z-axis involves an additional difficulty since, due to interference between the X-axis and Z-axis displacement components or a change in moment of inertia about each axis, in addition to the above-described problem peculiar to the driving system, the system becomes non-linear.

It is accordingly an object of the present invention to provide a supporting device by which the attitude of a member to be supported can be held with high precision even when a movable portion provided within the supported member moves.

In accordance with an aspect of the present invention, there is provided a supporting device for supporting a member having an inside movable portion, wherein the device comprises a supporting reference plate on which the member is to be placed, and three sets of driving mechanisms each being disposed between a main frame and the supporting reference plate and each having high-rigidity displacement providing means and low-rigidity supporting means of low damping factor, disposed in series.

In accordance with another aspect of the present invention, there is provided a supporting device for supporting a member having an inside movable portion, wherein the device includes a supporting reference plate on which the member is to be placed, three sets of driving mechanisms each being disposed between a main frame and the supporting reference plate and each having high-rigidity displacement providing means and low-rigidity supporting means of low damping factor, disposed in series, and supporting force predicting means for predicting a supporting force of each low-rigidity supporting means in accordance with the gravity center position of the movable portion, wherein each low-rigidity supporting means is displaced by a corresponding one of the high-rigidity displacement providing means of the driving mechanisms.

Here, displacement detecting means for detecting the amount of displacement of each high-rigidity displacement providing means of the three sets of driving mechanisms may be provided.

Further, there may be provided a thrust force providing mechanism having a fixed member and a movable member provided out of contact with the fixed member and provided fixedly on the supported member, for providing a thrust force in parallel with each low-rigidity supporting means of the driving mechanisms, and canceling force predicting means for predicting a force for canceling, with the thrust force providing mechanism, a reaction force and a moment received applied to the supported member when the movable portion moves, wherein the thrust force providing mechanism is driven in accordance with the force predicted by the canceling force predicting means.

Still further, there may be provided a damping force providing means having a fixed member and a movable member provided out of contact with the fixed member and provided fixedly on the supported member, for providing a damping force to the supported member.

Further, the device may comprise discriminating means for discriminating the completion of vibration damping of the supported member, and a blocking mechanism for blocking the thrust force providing mechanism and the damping force providing mechanism in response to the discrimination of the completion of vibration damping by the discriminating means.

Further, the device may comprise moving means for moving the high-rigidity displacement providing means each in a plane perpendicular to the direction in which displacement is produced by a corresponding high-rigidity displacement producing means, and coupling means for rotatably mounting each low-rigidity Supporting means to the positioning reference plate.

In a supporting means of the present invention, three sets of driving mechanisms each comprising high-rigidity displacement producing means and low-rigidity supporting means disposed in series with the high-rigidity displacement producing means and having a low damping factor, may be disposed between a main frame and a supporting reference plate on which a member to be supported and having an inside movable portion is placed. For holding the attitude of the supported member when the movable portion moves, each low-rigidity supporting means may be displaced by means of corresponding high-rigidity displacement producing means. This minimizes initial displacement of the low-rigidity supporting means and, as a result, prevents vibration of the low-rigidity supporting means.

An attitude control device of the present invention may be equipped with a supporting means and a supporting force predicting means for predicting the supporting force of each low-rigidity supporting means corresponding to the gravity center position of a movable portion accommodated in the supported member. Each low-rigidity supporting means can be displaced so as to produce supporting forces as predicted by the supporting force predicting means, such that only the application of a smallest displacement necessary for the control system assures counteracting to the static force resulting from the movement of the movable portion. Therefore, it is possible to hold the attitude of the supported member very precisely.

When a thrust producing mechanism and a canceling force predicting means are provided, it is possible to predict the force with which the reaction force and moment, applied to the supported member during acceleration of the movable portion, is to be canceled through the thrust producing mechanism, and it is possible for the thrust producing mechanism to produce forces to be applied to the supported member. It is therefore possible to counteract any dynamic force resulting from movement of the movable portion.

When a damping force producing means is provided, if the low-rigidity supporting means vibrates, it is possible to detect the vibration and to suppress the vibration.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 6A–6C are schematic views, respectively, wherein FIGS. 6A and 6B show the structures of fixing members while FIG. 6C shows the structure of a movable portion.

FIGS. 7A and 7B are schematic views of the structure of the linear motor shown in FIG. 4, wherein FIG. 7A shows the positional relationship between a fixed member and a movable member while FIG. 7B shows the positional relationship between a permanent magnet and a coil.

FIG. 10 is a schematic view of a supporting device according to a third embodiment of the present invention, and shows the connection between a CPU and each coil of linear motors of an attitude control device for an X-ray exposure apparatus.

FIGS. 19A and 19B are schematic views of another example of a linear motor, wherein FIG. 19A shows the positional relationship between a fixed member and a movable member while FIG. 19B shows the positional relationship between a permanent magnet and a coil.

FIGS. 21A and 21B are schematic views of a known example of an attitude control device for an X-ray exposure apparatus, wherein FIG. 21A is a top plan view while FIG. 21B is a front view.

DESCRIPTION OF THE PREFERRED EMBODIMENTS

Embodiments of the present invention will now be described with reference to the drawings.

Figure 1:
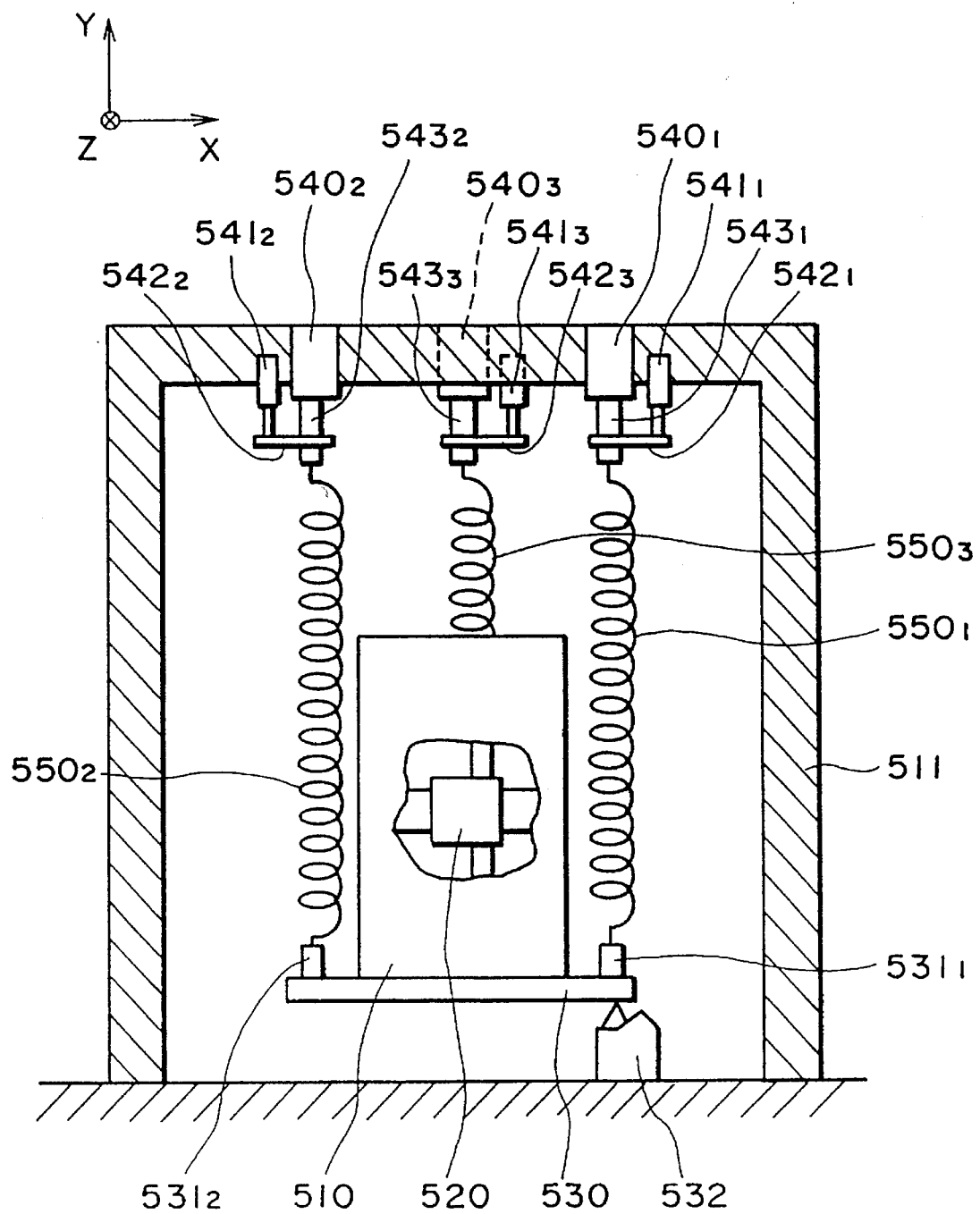
FIG. 1 is a schematic view of an attitude control device for an X-ray exposure apparatus, and shows a supporting device according to a first embodiment of the present invention.

FIG. 1 is a schematic view of an attitude control device for an X-ray exposure apparatus, and shows a supporting device according to a first embodiment of the present invention.

This attitude control device comprises constituent elements such as described below.

(a) Stage Frame 526 (FIG. 2):

This is a member to be supported and has a movable portion provided therewithin. Through the attitude control device of this embodiment, it is held at a constant attitude even when the movable portion moves.

Figure 2:
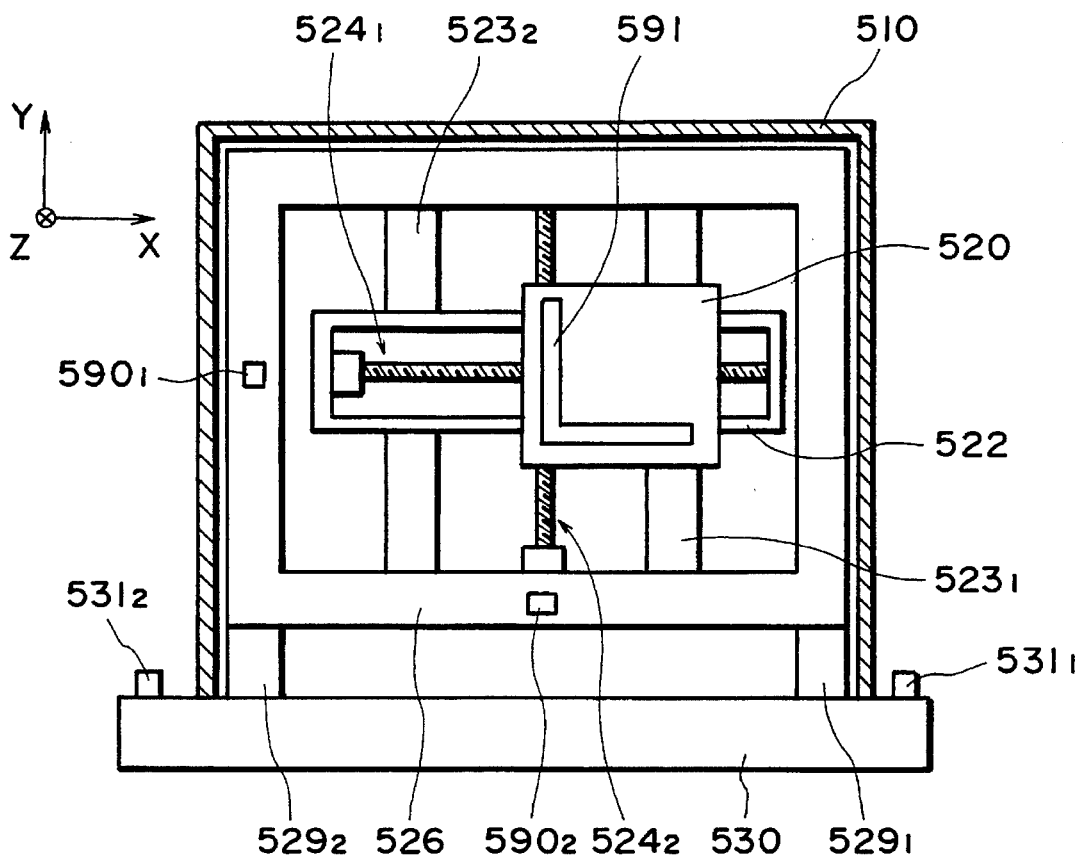
FIG. 2 is a schematic view of the structure of a vacuum chamber shown in FIG. 1.

As shown in FIG. 2, the stage frame 526 is placed in a vacuum chamber 510 and is supported by a supporting reference plate 530 through two stage frame mounting members $529_1$ and $529_2$. Disposed inside the stage frame 526 is a stage 520, as said movable portion, which is movable along X and Y axes of a coordinate system (X-Y-Z) illustrated, with its X-Z plane being on the floor.

The stage 520 is mounted to a Y-axis stage 522 having an X-axis driving device $524_1$ disposed therewithin. The stage 520 can be moved in the Y-axis direction illustrated, as a result of movement of the Y-axis stage 522 along two Y-axis guides $523_1$ and $523_2$ by a Y-axis driving device $524_2$. Also, the stage 520 can be moved in the X-axis direction illustrated, by means of the X-axis driving device $524_1$. It is to be noted here that also the Y-axis stage serves as said movable portion.

Each of the X-axis driving device $524_1$ and the Y-axis driving device $524_2$ is provided by a ball-screw mechanism of know type, having a combination of a ball screw and a motor.

(b) Supporting Reference Plate 530:

The supporting reference plate 530 is a member on which the vacuum chamber 510 and the stage frame 526 are placed.

(c) Three Sets of Driving Mechanisms:

Each driving mechanism is disposed between the supporting reference plate and the main frame, and each comprises high-rigidity displacement producing means and low-rigidity supporting means disposed in series with the high-rigidity displacement producing means and having a low attenuation factor.

In this embodiment, as shown in FIG. 1, a first driving mechanism comprises (i) a coiled spring (low-rigidity supporting means) $550_1$ having an end connected to the supporting reference plate 530 through a spring mounting member $531_1$, provided on the supporting reference plate 530 in a front and righthand side portion, as viewed in the drawing, adjacent to the vacuum chamber 510 and (ii) a hydraulic cylinder (high-rigidity displacement producing means) $540_1$ which is coupled in series to the other end of the coiled spring $550_1$ through a rod $543_1$ and is fixedly provided on the top plate of the main frame 511.

A second driving mechanism comprises (i) a coiled spring (low-rigidity supporting means) $550_2$ having an end connected to the supporting reference plate 530 through a spring mounting member $531_2$, provided on the supporting reference plate 530 in a front and left-hand side portion, as viewed in the drawing, adjacent to the vacuum cheer 510 and (ii) a hydraulic cylinder (high-rigidity displacement producing means) $540_2$ which is coupled in series to the other end of the coiled spring $550_2$ through a rod $543_2$ and is fixedly provided on the top plate of the main frame 511.

A third driving mechanism comprises (i) a coiled spring (low-rigidity supporting means) $550_3$ having an end connected to the supporting reference plate 530 through a spring mounting member $531_3$ (FIG. 3), provided on the supporting reference plate 530 in a middle and rear side portion, as viewed in the drawing, adjacent to the vacuum chamber 510 and (ii) a hydraulic cylinder (high-rigidity displacement producing means) $540_3$ which is coupled in series to the other end of the coiled spring $550_3$ through a rod $543_3$ and is fixedly provided on the top plate of the main frame 511.

(d) Displacement Detecting Means:

The displacement detecting means serves to detect the amount of displacement of each of the respective high-rigidity displacement producing means of the three sets of driving mechanisms.

In this embodiment, as the displacement detecting means, there are provided a displacement detecting sensor $541_1$ for detecting the amount of displacement of the rod $543_1$ of the hydraulic cylinder $540_1$, a displacement detecting sensor $541_2$ for detecting the amount of displacement of the rod $543_2$ of the hydraulic cylinder $540_2$, and a displacement detecting sensor $541_3$ for detecting the amount of displacement of the rod $543_3$ of the hydraulic cylinder $540_3$.

Here, the displacement sensor $541_1$ has a free end which is urged downwardly so that normally it contacts the upper surface of a displacement detecting reference plate $542_1$ mounted to the rod $543_1$ of the hydraulic cylinder $540_1$, and thus it detects the amount of displacement of the rod $543_1$ in the Y-axis axis direction (direction of height) illustrated. In a similar manner, the remaining two displacement sensors $541_2$ and $541_3$ detect the amount of displacement of the rod $543_2$ of the hydraulic cylinder $540_2$ and that of the rod $543_3$ of the hydraulic cylinder $540_3$, respectively.

(e) Control Mechanism:

The control mechanism includes supporting force predicting means for predicting the supporting force of each of the coiled springs $550_1$–$550_3$ of the three sets of driving mechanisms, corresponding to the gravity center positions of the stage 520 and the Y-axis stage 522, respectively.

The attitude control device of this embodiment includes, as the supporting force predicting means, (i) three distortion gauges (not shown) attached to the coiled springs $550_1$–$550_3$, respectively, (it) measuring means for detecting the position of the gravity center α of the stage 520 as well as the position of the gravity center β of the Y-axis stage 522, and (iii) a central processing unit (CPU), not shown, for determining the supporting forces. The measuring means comprises a laser interferometer (not shown) of known type, and the gravity center position can be detected from the positional relationship of the stage 520 with respect to the stage frame 526 which can be measured by the laser interferometer by projecting a laser beam to an L-shaped movable mirror 591 (FIG. 2), provided on the stage 520, and two fixed mirrors $590_1$ and $590_2$ (FIG. 2) provided on the stage frame 526.

The operation of the attitude control device of this embodiment will be explained.

Prior to moving the stage 520 and the Y-axis stage 522, the CPU predicts the amount of the displacement of the stage 520 and that of the Y-axis stage 522. Then, in accordance with the results of the prediction, it supplies driving signals to the hydraulic cylinders $540_1$–$5450_3$, respectively, in accordance with the results of the prediction, by which the supporting reference plate 530 is so controlled that it is held continuously parallel to the floor and by which the attitude of the stage frame 526 is held unchanged. Here, these amounts of movements are stored in a memory (not shown) beforehand and, as required, the CPU reads these amounts out of the memory and produces driving signals through computations such as follows:

Now, a case wherein the stage 520 is moved by the X-axis driving device $524_1$ by ΔX and is moved by the Y-axis driving device $524_2$ by ΔY (the Y-axis stage is moved by ΔY, too), is considered.

Here, component forces are defined as below.

(a) Component Forces P1o, P2o and P3o and Component Forces P1, P2 and P3:

These component forces are those which are to be produced in the spring mounting members $531_1$–$531_3$, respectively, of the supporting reference plate 530 by the three coiled springs $550_1$–$550_3$, in order to hold the attitude of the stage frame 526. Here, the component forces P1o–P3o are those prior to the movement of the stage 520; whereas the component forces P1m–P3m are those after the movement of the stage 520.

(b) Component Forces P1mo, P2mo and P3mo and Component Forces P1m, P2m and P3m:

These component forces are those of the gravity of the stage 520 as applied to the spring mounting members $531_1$–$531_3$, respectively, of the supporting reference plate 530. Here, the component forces P1mo–P3mo are those prior to the movement of the stage 520: whereas the component forces P1m–P3m are those after the movement of the stage 520.

(c) Component Forces P1no, P2no and P3no and Component Forces P1n, P2n and P3n:

These component forces are those of the gravity of the Y-axis stage 522 as applied to the spring mounting members $531_1$–$531_3$, respectively, of the supporting reference plate 530. Here, the component forces P1no–P3no are those prior to the movement of the stage 520; whereas the component forces P1n–P3n are those after the movement of the stage 520.

(d) Component Forces P1co, P2co and P3co and Component Forces P1c, P2c and P3c:

These component forces are those of the gravity of elements (such as the vacuum chamber 510) other than the stage 520 and the Y-axis stage 522, as applied to the spring mounting members $531_1$–$531_3$, respectively, of the supporting reference plate 530. Here, the component forces P1co–P3co are those prior to the movement of the stage 520; whereas the component forces P1c–P3c are those after the movement of the stage 520.

Now, those other than the stage 520 and the Y-axis stage 522 do not move, and the component forces P1co–P3co as well as the component forces P1c–P3c are known and unchangeable. Therefore, the attitude of the stage frame 526 can be held, after movement of the stage 520, by applying forces P1, P2 and P3 as represented by the following equations to the spring mounting members $531_1$–$531_3$, respectively, of the supporting reference plate by using the coiled springs $550_1$–$550_3$, respectively:

$$P1=(P1m+P1n)-(P1mo+P1no) \quad (7)$$

$$P2=(P2m+P2n)-(P2mo+P2no) \quad (8)$$

$$P3=(P3m+P3n)-(P3mo+P3no) \quad (9)$$

Since the component forces P1o, P2o and P3o can be detected through the distortion gauges attached to the coiled springs $550_1$–$550_3$, respectively, the forces P1mo+P1no, P2mo+P2no and P3mo+P3no in the right sides of equations (7)–(9) can be determined in accordance with the following equations:

$$P1mo+P1no=P1o-P1c \quad (10)$$

$$P2mo+P2no=P2o-P2c \quad (11)$$

$$P3mo+P3no=P3o-P3c \quad (12)$$

Also, the forces P1m+P1n, P2m+P2n and P3m+P3n in the right sides of equations (7)–(9) can be determined in the following manner:

As described, since the attitude control device of this embodiment is equipped with measuring means, it is possible to determine the coordinates $S_1$–$S_3$ of the gravity center α of the stage 520, when the spring mounting members $531_1$–$531_3$ of the supporting reference plate 530 are taken as origins, as well as the coordinates $SY_1$–$SY_3$ of the gravity center α of the Y-axis stage 522.

Figure 3:
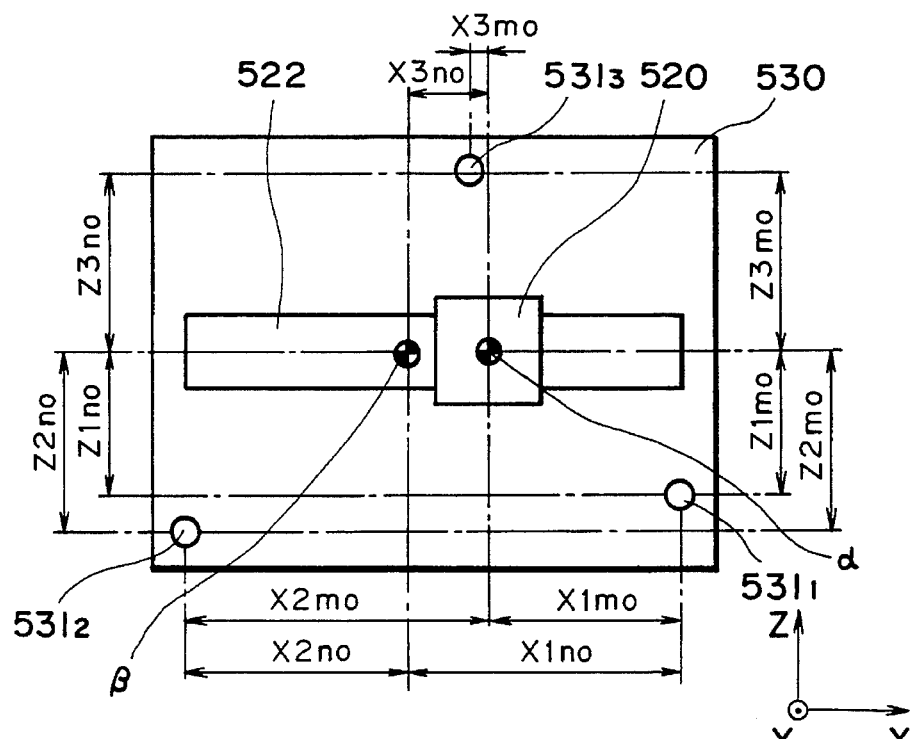
FIG. 3 is a schematic view, showing coordinates of a gravity center and coordinates of a gravity center of an X-Y stage, with spring mounting members being taken as respective origins.

Assuming now that the stage 520 and the Y-axis stage 522 are at those positions as shown in FIG. 3, the coordinates $S_1$–$S_3$ and $SY_1$–$SY_3$ can be expressed as follows:

$S_1$ (X1mo, Y1mo, Z1mo)

$S_2$ (X2mo, Y2mo, Z2mo)

$S_3$ (X3mo, Y3mo, Z3mo)

$SY_1$ (X1no, Y1no, Z1no)

$SY_2$ (X2no, Y2no, Z2no)

$SY_3$ (X3no, Y3no, Z3no)

Here, if the mass of the stage 520 is Mm and the mass of the Y-axis stage is Mn, then equations regarding the balance of gravity and the balance of moment about the gravity center, of the stage 520 after movement, as well as equations regarding the balance of gravity and the balance of moment about the gravity center, of the Y-axis stage 522 after movement, are such as follows:

$$P1m+P2m+P3m=Mm\cdot g \quad (13)$$

$$(X1mo+\Delta X)\cdot P1m+(X2mo+\Delta X)\cdot P2m+(X3mo+\Delta X)\cdot P3m=0 \quad (14)$$

$$Z1mo\cdot P1m+Z2mo\cdot P2m+Z3mo\cdot P3m=0 \quad (15)$$

$$P1n+P2n+P3n=Mn\cdot g \quad (16)$$

$$X1no\cdot P1n+X2no\cdot P2n+X3no\cdot P3n=0 \quad (17)$$

$$Z1no\cdot P1n+Z2no\cdot P2n+Z3no\cdot P3n=0 \quad (18)$$

From equations (13)–(18) and by using ΔX as a function, the component forces P1m–P3m and P1n–P3n can be determined. Therefore, it is possible to determine the forces P1m+P1n, P2m+P2n and P3m+P3n in the right sides of equations (7)–(9).

It is to be noted here that the forces P1–P3 as represented by equations (7)–(9) can be applied to the spring mounting members $531_1$–$531_3$, respectively, of the supporting reference plate 530 with the coiled springs $550_1$–$550_3$, respectively, by applying to the coiled springs $550_1$–$550_3$ such displacements $\Delta L_1$–$\Delta L_3$ as expressed by the following equations:

$$\Delta L_1=P1/K \quad (19)$$

$$\Delta L_2=P2/K \quad (20)$$

$$\Delta L_3=P3/K \quad (21)$$

wherein K is the constant of each of the springs $550_1$–$550_3$.

The above-described computations are all carried out in the CPU, and the CPU supplies those driving signals to the hydraulic cylinders $540_1$–$540_3$ by which the displacements $\Delta L_1$–$\Delta L_3$ as determined by equations (19)–(21) are applied to the coiled springs $550_1$–$550_3$, respectively. After supplying the driving signals, the CPU receives an output signal from supporting reference plate displacement detecting sensors 532 and finally checks the attitude of the stage frame 526 (subject of control) after execution of the control.

It is to be noted that, in regard to the actuation of the hydraulic cylinders $540_1$–$540_3$, a closed loop control system is provided, for stabilized control, wherein the driving signals as well as the output signals of the displacement sensors $541_1$–$541_3$ are inputted to servo circuits (not shown) provided in relation to the hydraulic cylinders $540_1$–$540_3$.

However, in place of the hydraulic cylinders $540_1$–$540_3$, as an example, a combination of a ball screw mechanism and a pulse motor of known type may be used and an open loop control system may be provided wherein the ball screw mechanism is driven by the pulse motor to apply displacement to the coiled spring $550_1$. On that occasion, use of the displacement sensors $541_1$–$541_3$ is not necessary.

Further, while each of the displacements $\Delta L_1$–$\Delta L_3$ corresponding to the amount of movement (ΔX, ΔY, ΔZ) to a target position of the stage 520 may be applied at once, as an alternative, those displacements $\Delta L_1(t)$–$\Delta L_3(t)$ corresponding to the movement amount (ΔX(t), ΔY(t), ΔZ(t)) of the stage 520 for each regular time period t may be stored in the memory and the hydraulic cylinders $540_1$–$540_3$ may be actuated at regular intervals t.

Figure 4:
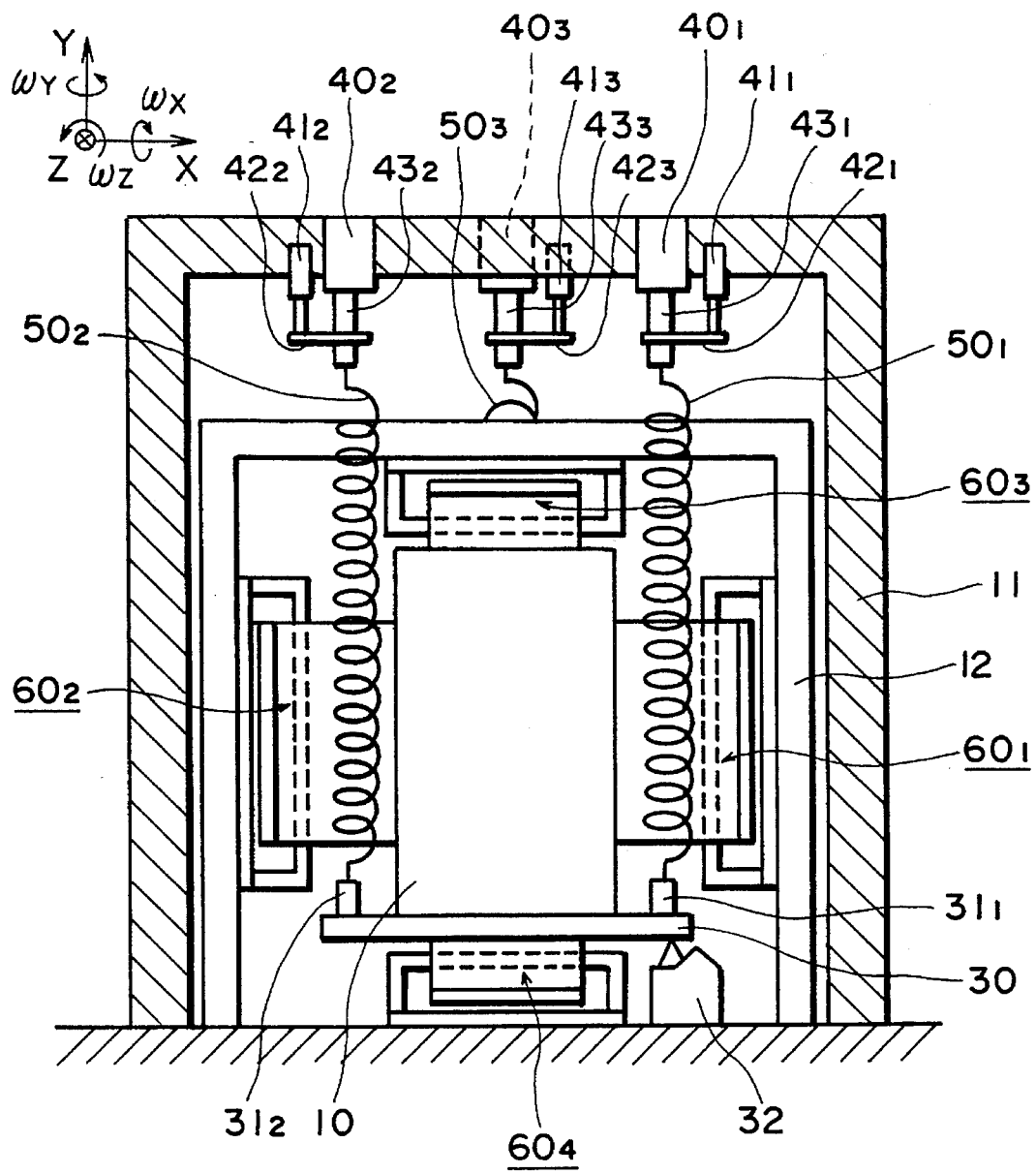
FIG. 4 is a schematic view of an attitude control device for an X-ray exposure apparatus, and shows a supporting device according to a second embodiment of the present invention.

FIG. 4 is a schematic view of an attitude control device according to a second embodiment of the present invention.

This attitude control device differs from the FIG. 1 device in that the former comprises a subsidiary frame 12 provided between a main frame 11 and a vacuum chamber 10 as well as four linear motors each being provided between a top or side plate of the subsidiary frame 12 and the vacuum chamber 10 or between the floor and the vacuum chamber 10 and in that a CPU 70 shown in FIG. 8 includes canceling force predicting means (to be described later).

More specifically, as compared with the attitude control device of FIG. 1 by which the attitude of the stage frame 526 can be held against a static force as the stage 520 or the Y-axis stage 522 moves, the attitude control device of this embodiment is operable to hold the attitude of the stage frame 26 against a dynamic force, in addition to a static force, as a stage 20 or a Y-axis stage 22 (FIG. 5) moves.

The function of this attitude control device for holding the attitude of the stage frame 26 against a static force, is substantially the same as that of the FIG. 1 device. Therefore, description will now be made of the function of holding the attitude of the stage frame 26 against a dynamic force, through cooperation of the four linear motors $60_1$–$60_4$ and the canceling force predicting means.

The linear motors $60_1$–$60_4$ serve as four sets of thrust producing mechanisms for producing thrusts in parallel to coiled springs (low-rigidity supporting means) $50_1$–$50_3$, each mechanism comprising a first fixed member $62_1$ (FIG. 6C) which is fixedly secured to the subsidiary frame (a frame having high rigidity) 12, and a movable member $66_1$ (FIG. 6B) which is provided out of contact with the first fixed member $62_1$ and is fixed to the stage frame (member to be supported) 26.

Since the linear motors $60_1$–$60_4$ have the same structure, one ($60_1$) of them will be explained here.

Figure 6A:
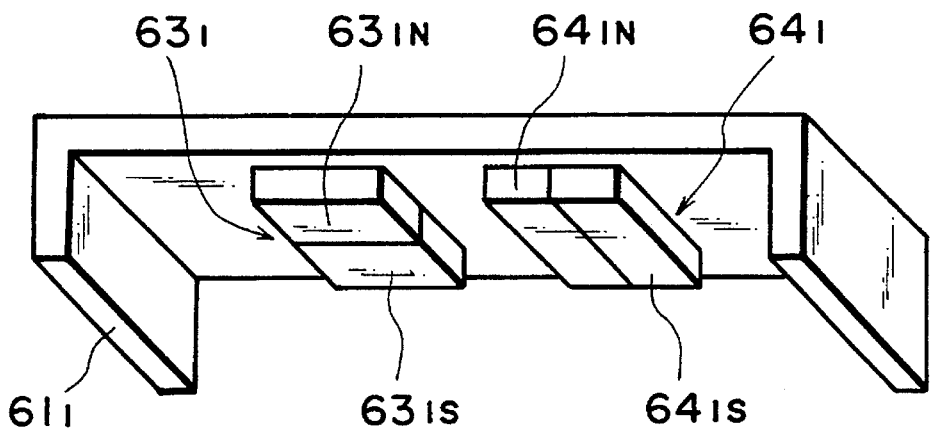
Figure 6B:
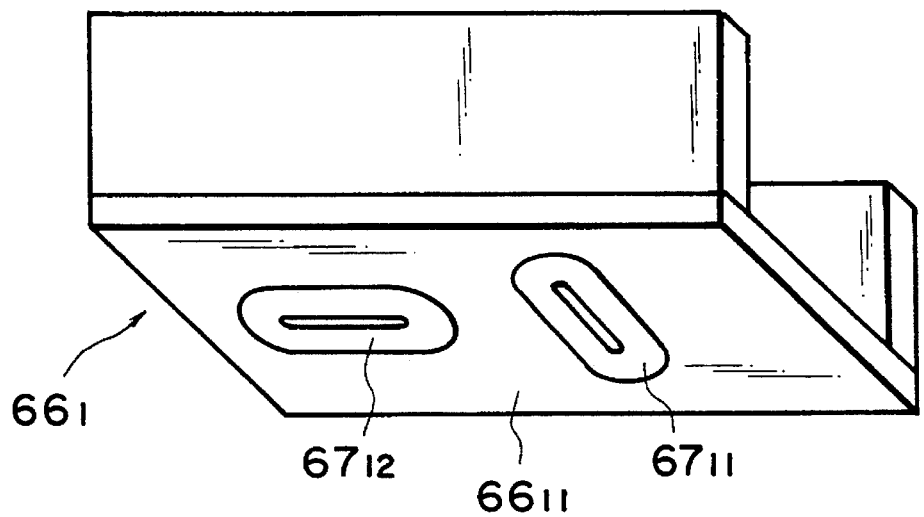
Figure 6C:
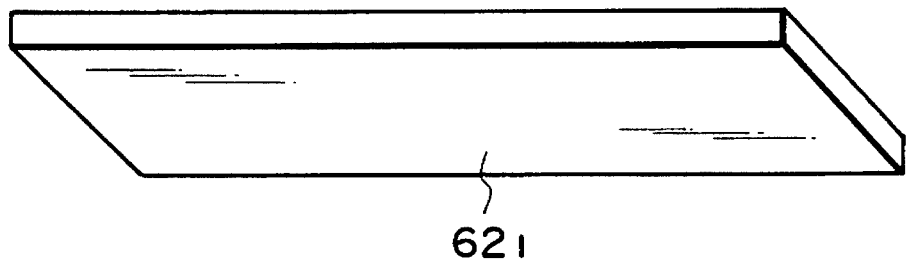

As shown in FIGS. 6A–6C, the linear motor $60_1$ comprises constituent elements such as described below.

(a) First Fixed Member $62_1$:

The first fixed member $62_1$ is shown in FIG. 6C, and the linear motor $60_1$ is fixedly mounted on a surface at the right-hand side of the subsidiary frame 12 as viewed in FIG. 4. Also, it is made of a ferromagnetic material, to provide a yoke.

(b) Second Fixed Member $61_1$:

The second fixed member $61_1$ is shown in FIG. 6A and it has a channel-like shape, having a wall opposed to the first fixed member $62_1$ and two side walls (see FIG. 7A) an end of each of which is fixed to an end of the top surface of the fixed member $62_1$. Also, it is made of a ferromagnetic material, to provide a yoke.

(c) Two Permanent Magnets $63_1$ and $64_1$:

These two permanent magnets $63_1$ and $64_1$ are mounted along a longitudinal center line of a surface of the second fixed member $61_1$ as opposed to the first fixed member $62_1$. Here, as shown in FIG. 6A, the permanent magnet $63_1$ mounted to a portion at the left-hand side of the opposed surface of the second fixed member $61_1$, has an N-pole $63_{1N}$ at a front side thereof and an S-pole $63_{1S}$ at a rear side thereof, as viewed in the drawing. Also, the permanent magnet $64_1$ mounted to a portion at the right-hand side of the opposed surface of the second fixed member $61_1$, has an N-pole $64_{1N}$ at a left-hand side and an S-pole $64_{1S}$ at a right-hand side, as viewed in the drawing.

(d) Movable Member $66_1$:

As shown in FIG. 6B, the movable member $66_1$ has a channel-like shape and is made of a material having a large electric resistance, for preventing production of an induced current. Also, two coils $67_{11}$ and $67_{12}$ are embedded within the bottom of the movable member $66_1$, wherein straight portions of them are placed with mutual deviation of 90 deg. at those positions opposed to the N-pole $63_{1N}$ and the S-pole $63_{1S}$ of the permanent magnet $63_1$ and to the N-pole $64_{1N}$ and the S-pole $64_{1S}$ of the permanent magnet $64_1$ (see FIG. 7B).

Figure 8:
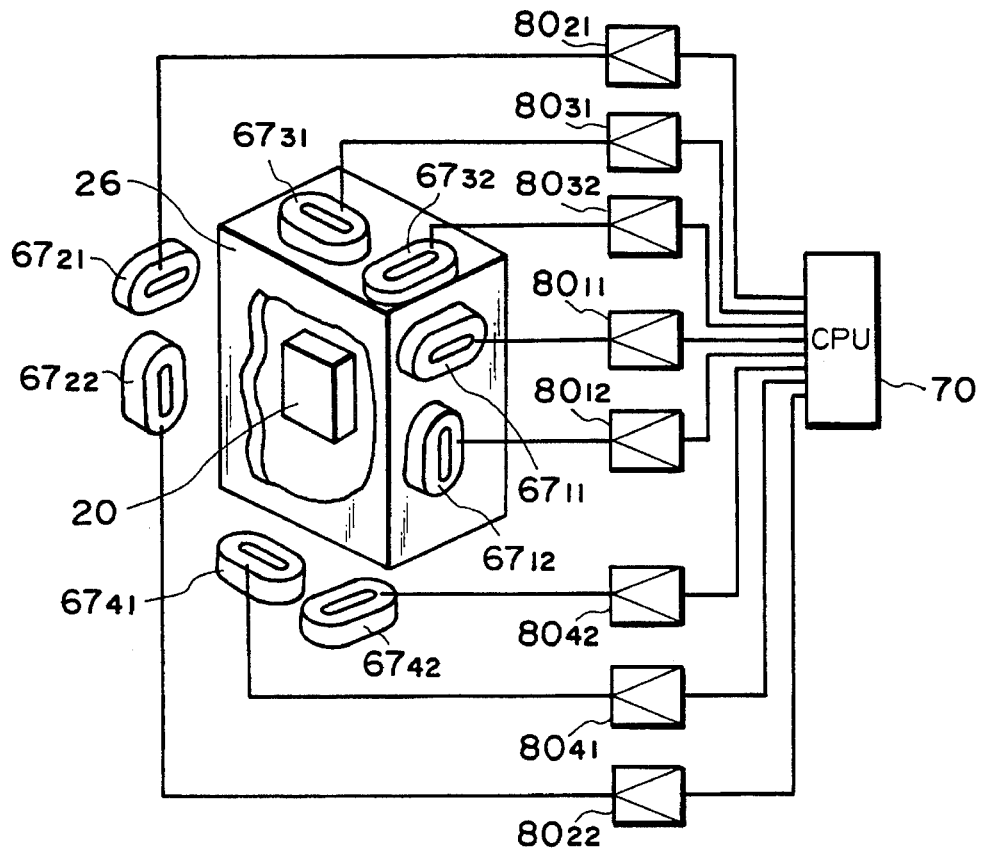
FIG. 8 is a schematic view showing the connection of each linear motor of FIG. 4 to a CPU.

As shown in FIG. 8, the coils $67_{11}$ and $67_{12}$ of the linear motor $60_1$ are connected to a CPU 70 through current amplifiers $80_{11}$ and $80_{12}$, respectively, and they are driven by this CPU 70.

Figure 7A:
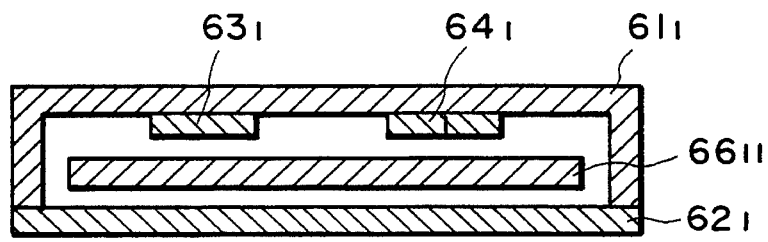
Figure 7B:
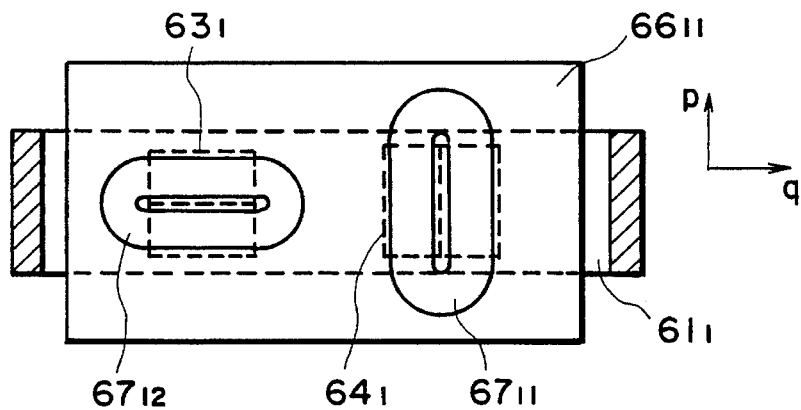

Further, as shown in FIG. 7A, the movable member $66_1$ has its bottom surface $66_{11}$ sandwiched in a non-contact state between the second fixed member $61_1$ and the first fixed member $62_1$.

Figure 5:
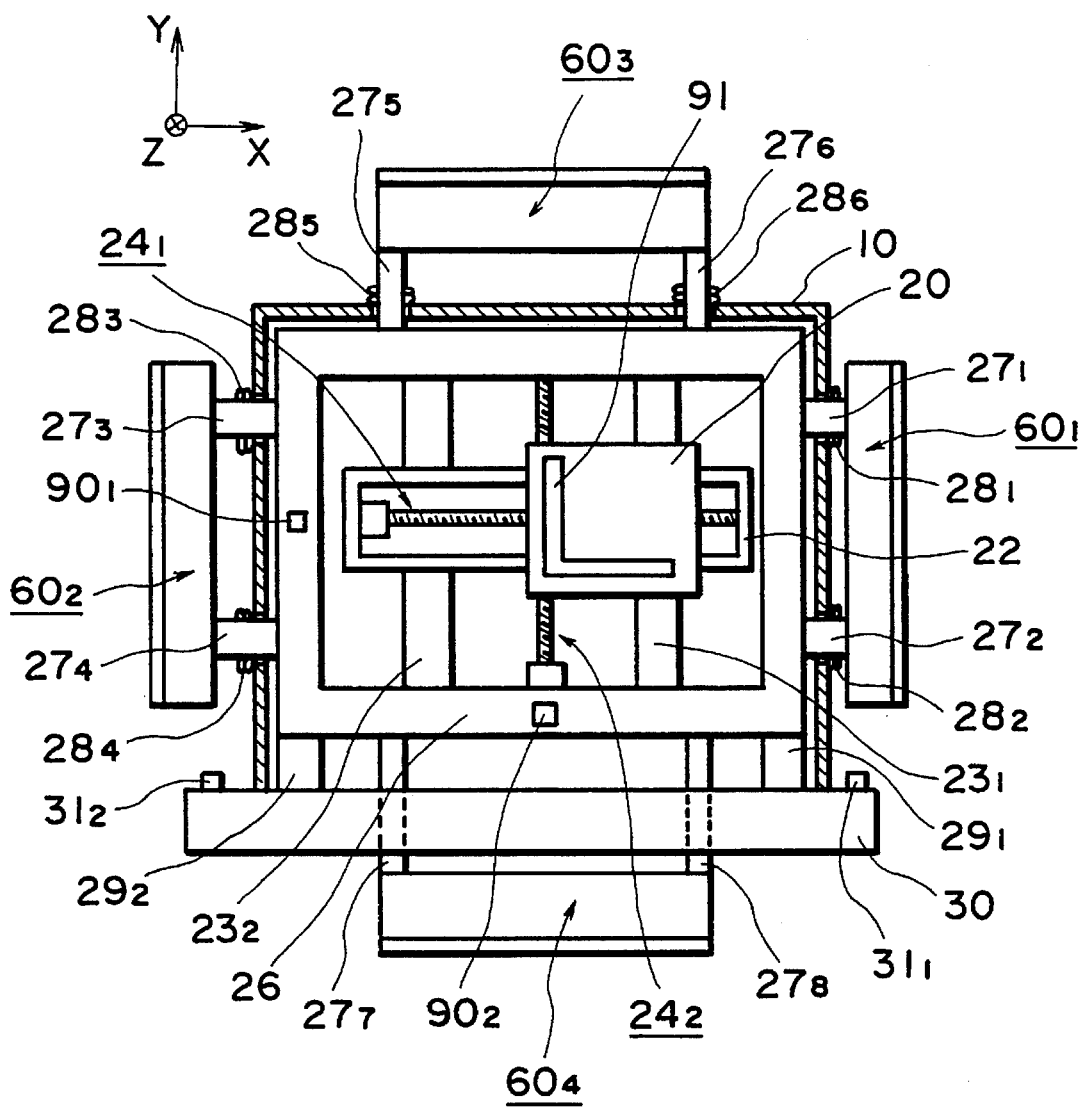
FIG. 5 is a schematic view of an inside structure of a vacuum chamber shown in FIG. 4, and shows the manner of mounting to a stage frame of each linear motor.

Referring now to FIG. 5, the manner of fixing the linear motors $60_1$–$60_4$ to the stage frame 26 will be explained.

For the fixation of the linear motor $60_1$ to the right-hand side of the stage frame 26, as viewed in the drawing, four linear motor mounting members are used (only two $27_1$ and $27_2$ of them are illustrated).

Here, each of the two mounting members $27_1$ and $27_2$ has an end fixed to the front side of the movable member $66_1$, as viewed in the drawing, and another end fixed to the right-hand side of the stage frame 26 as viewed in the drawing. Also, these mounting members are loosely fitted into two bores, respectively, formed in the right-hand side of the vacuum chamber 10 as viewed in the drawing. The unshown two linear motor mounting members each has an end fixed to the rear side of the movable member, as viewed in the drawing, and another end fixed to the right-hand side of the stage frame 26 as viewed in the drawing. These unshown mounting members are loosely fitted into two bores, respectively, formed in the right-hand side of the vacuum chamber at positions rearwardly of the aforementioned two bores, as viewed in the drawing.

Mounted to the outside portions of these four bores are bellows (only two $28_1$ and $28_2$ of them are shown) which serve to tightly close the vacuum chamber 10 and also to prevent transmission of any deformation thereof to the stage frame 26.

The fixation of the linear motor $60_2$ to the left-hand side of the stage frame 26 as viewed in the drawing and the fixation of the linear motor $60_3$ to the top of the stage frame 26, are made in a similar manner as described.

The fixation of the linear motor $60_4$ to the bottom of the stage frame 26 is made through four linear motor mounting members (only two $27_7$ and $27_8$ of them are shown) inserted into four bores formed in the supporting reference plate 30. However, no bellows is mounted to the outside of each bore, such that displacement of the supporting reference plate 30 causes displacement of the stage frame 26, through the motor mounting members.

The control mechanism of this attitude control device is similar to that shown in FIG. 1 in that it comprises: three distortion gauges (supporting force predicting means), not shown, attached to the coiled springs $50_1$–$50_3$ of the three sets of driving mechanisms, respectively, for predicting the supporting forces of the coiled springs $50_1$–$50_3$, respectively, corresponding to the gravity center positions of the stage 20 and the Y-axis stage 22; measuring means for detecting the position of the gravity center α of the stage 20 as well as the position of the gravity center β of the Y-axis stage 22; and a CPU 70 (see FIG. 8) for determining the supporting forces. However, it differs from the control mechanism of the attitude control device of FIG. 1 in that the CPU 70 includes canceling force predicting means for predicting, when the movable member (i.e. the stage 20 or the Y-axis stage 22) is accelerated, such force that the reaction force or reaction moment received by the supported member (i.e. the stage frame 26) is canceled by the thrust producing mechanisms (i.e. the linear motors $60_1$–$60_4$).

The operation of this attitude control device will now be explained.

The static force balancing when the stage 20 and the Y-axis stage 22 move is attainable in a similar manner as in the attitude control device of FIG. 1 and, therefore, it is not explained here. Only the dynamic force balancing as the stage 20 and the Y-axis stage 22 move, will now be explained.

Figure 9:
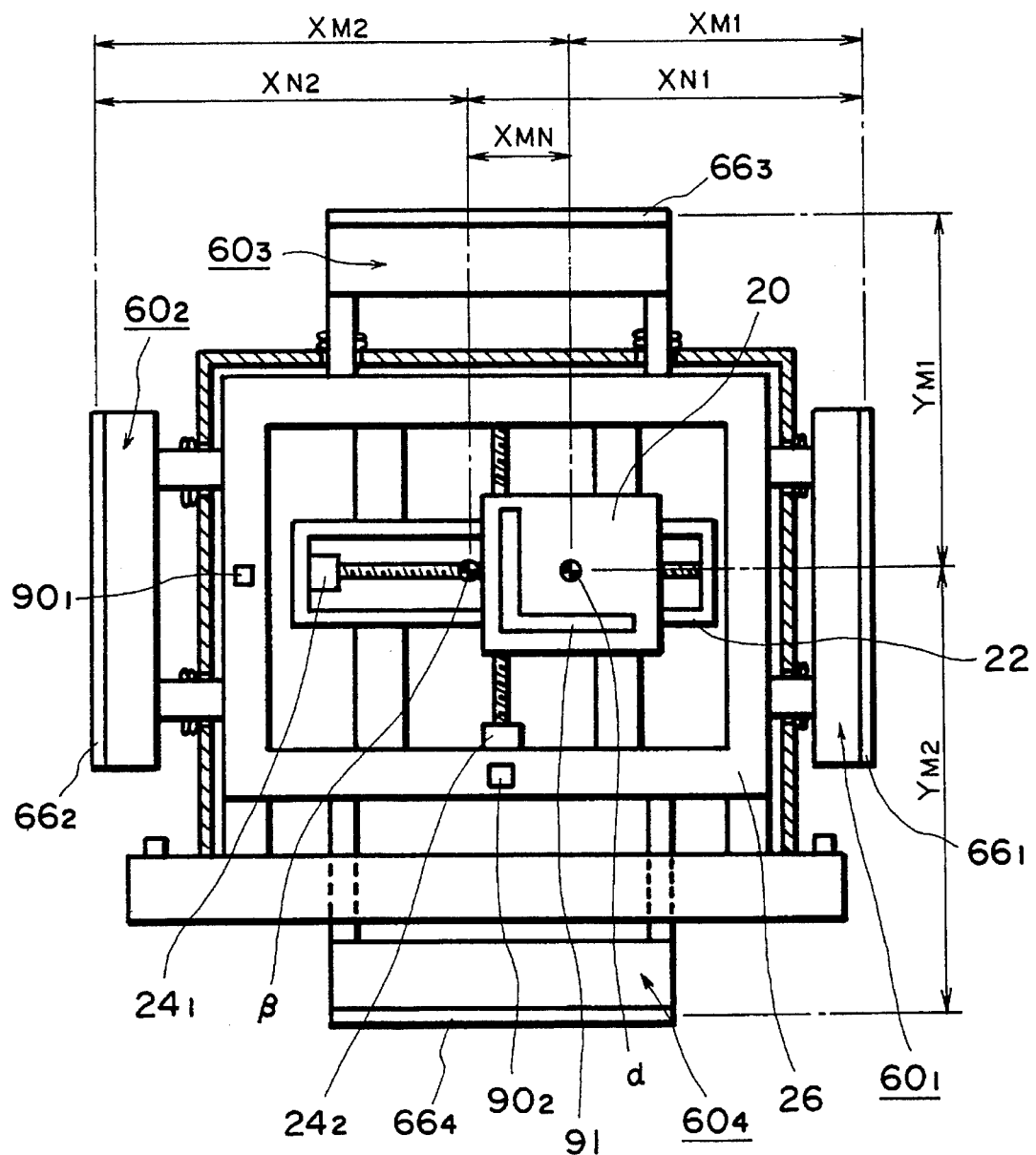
FIG. 9 is a schematic view for explaining the distances between each linear motor of FIG. 4 and the gravity centers of the stage and the Y-axis stage.

The following distances can be measured with the above-described measuring means (see FIG. 9).

(a) Distance $X_{M1}$: The distance from the gravity center α of the stage 20 to the center of the movable member $66_1$ along the X axis illustrated. It changes with the movement of the stage 20.

(b) Distance $X_{M2}$: The distance from the gravity center α of the stage 320 to the center of the movable member $66_2$ along the X axis illustrated. It changes with the movement of the stage 20.

(c) Distance $X_{N1}$: The distance from the gravity center β of the Y-axis stage 22 to the center of the movable member $66_1$ along the X axis illustrated. It does not change with the movement of the stage 20.

(d) Distance $X_{N2}$: The distance from the gravity center β of the Y-axis stage 22 to the center of the movable member $66_2$ along the X axis illustrated. It does not change with the movement of the stage 20.

(e) Distance $Y_{M1}$: The distance from the gravity center α of the stage 20 to the center of the movable member $66_3$ along the Y axis illustrated. It changes with the movement of the stage 20.

(f) Distance $Y_{M2}$: The distance from the gravity center α of the stage 20 to the center of the movable member $66_4$ along the Y axis illustrated. It changes with the movement of the stage 20.

(g) Distance $X_{MN}$: The distance from the gravity center α of the stage 20 to the gravity center β of the Y-axis stage 22 along the X axis illustrated. It changes only when the stage 20 moves in the X-axis direction illustrated.

First, the balance of force $F_X$ applied to the stage 20 as it is moved in the X-axis direction illustrated by means of the X-axis driving device $24_1$, is considered.

The reaction force and reaction moment resulting from the force $F_X$ can be canceled by producing thrusts $F_U$ and $F_D$, to be expressed below, and this can be attained by applying drive currents to a coil $67_{32}$ of the linear motor $60_3$ fixedly provided on the top of the stage frame 26 (FIG. 8) and to a coil $67_{42}$ of the linear motor $60_4$ fixedly provided on the bottom of the stage frame 26.

$$F_U = F_X X_{M1}/(X_{M1} + X_{M2}) \quad (22)$$

$$F_D = F_X X_{M2}/(X_{M1} + X_{M2}) \quad (23)$$

Next, the balance of force $F_Y$ applied to the stage 20 and the Y-axis stage 22 as the latter is moved in the Y-axis direction illustrated by means of the Y-axis driving device $24_2$, is considered.

Here, the acceleration $a_Y$ of the stage 20 and the Y-axis stage 22 is:

$$a_Y = F_Y/(Mm + Mn) \quad (24)$$

and clockwise reaction moment $Mm \cdot a_Y$, in the drawing, is applied to the Y-axis stage 22 from the stage 20.

The reaction force and the reaction moment resulting from the force $F_Y$ can be canceled by producing thrusts $F_L$ and $F_R$, to be expressed below, and this can be attained by applying drive currents to a coil $67_{11}$ of the linear motor $60_1$ fixedly provided on the right-hand side of the stage frame (FIG. 8) and to a coil $67_{21}$ of the linear motor $60_2$ fixedly provided on the left-hand side of the stage frame 26.

$$F_L = (F_Y X_{N2} - Mm \cdot a_Y X_{MN})/(X_{N1} + X_{N2}) \quad (25)$$

$$F_R = (F_Y X_{N1} + Mm \cdot a_Y X_{MN})/(X_{N1} + X_{N2}) \quad (26)$$

Since in an exposure apparatus the amount of movement of each of the stage 20 and the Y-axis stage 22 is predetermined, these amounts may be stored into a memory (not shown) beforehand and the CPU 70 in FIG. 8 may read the amount of movement at that moment out of the memory and execute the computations according to equations (22)–(26) to determine the thrusts $F_U$, $F_D$, $F_L$ and $F_R$. Then, by applying corresponding drive currents to the coils $67_{32}$, $67_{42}$, $67_{11}$ and $67_{21}$ through the current amplifiers $80_{32}$, $80_{42}$, $80_{11}$ and $80_{21}$, respectively, it is possible to hold the attitude of the stage frame 26 against the dynamic force.

Here, as the amount of movement for each of the stage 29 and the Y-axis stage 22, the distances to the target positions of them may be stored into the memory. Alternatively, however, the amount of movement at each time moment may be memorized and those thrusts $F_U(t)$, $F_D(t)$, $F_L(t)$ and $F_R(t)$ at each time moment may be determined by the CPU 70 in a similar manner, to thereby hold the attitude of the stage frame 26 against the dynamic force.

FIG. 10 is a schematic view of an attitude control device according to a third embodiment of the present invention, and shows the connection to a CPU of coils of linear motors of an attitude control device in an X-ray exposure apparatus.

This attitude control device differs from that shown in FIG. 4 in that it is equipped with four sets of damping force producing mechanisms each comprising a fixed member and a movable member disposed out of contact with the fixed member and fixedly provided on a member to be supported, the mechanisms providing damping forces in directions of six axes, to the member to be supported.

Figure 11:
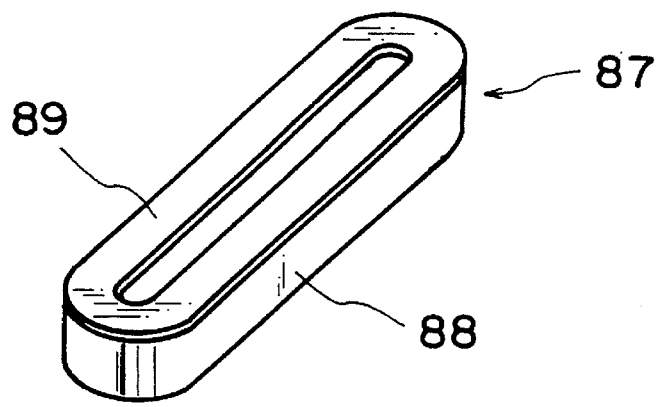
FIG. 11 is a schematic view of the structure of each coil of FIG. 10.

More specifically, in this attitude control device, the coils $67_{11}$, $67_{12}$, $67_{21}$, $67_{22}$, $67_{31}$, $67_{32}$, $67_{41}$ and $67_{42}$ (FIG. 8) constituting the linear motors $60_1$–$60_4$ of FIG. 4, are replaced by coils $87_{11}$, $87_{12}$, $87_{21}$, $87_{22}$, $87_{31}$, $87_{32}$, $87_{41}$ and $87_{42}$ (FIG. 8) each of the same structure as a coil 87 having a thrust producing portion 88 and a speed detecting portion 89 as shown in FIG. 11. As shown in FIG. 10, an induced current produced at the speed detecting portion 89 of the coil $87_{11}$ ($87_{12}$, $87_{21}$, $87_{22}$, $87_{31}$, $87_{32}$, $87_{41}$, $87_{42}$) is applied to a current amplifier $80_{11}$ ($80_{12}$, $80_{21}$, $80_{22}$, $80_{31}$, $80_{32}$, $80_{41}$, $80_{42}$) through an amplifier $82_{11}$ ($82_{12}$, $82_{21}$, $82_{22}$, $82_{31}$, $82_{32}$, $82_{41}$, $82_{42}$) and a servo circuit $81_{c11}$ ($81_{12}$, $81_{21}$, $81_{22}$, $81_{31}$, $81_{32}$, $81_{41}$, $81_{42}$). Thus, each linear motor (not shown) is equipped with a thrust producing function and a damping force producing function.

As described hereinbefore, even when a static force and a dynamic force caused by movement of the stage or the Y-axis stage are canceled, if there is a time lag, such a static force and a dynamic force cannot always be canceled completely and small vibration occurs in each spring $50_1$–$50_3$, constituting the driving mechanisms. Since each spring is low in attenuation and rigidity, it takes a long time period until the vibration is extinguished completely. In the attitude control device of this example, in consideration thereof, induced currents proportional to the components of vibration produced at the speed detecting portions 89 of the coils $87_{11}$, $87_{12}$, $87_{21}$, $87_{22}$, $87_{31}$, $87_{32}$, $87_{41}$ and $87_{42}$, respectively, are applied to the current amplifiers $80_{11}$, $80_{12}$, $80_{21}$, $80_{22}$, $80_{31}$, $80_{32}$, $80_{41}$ and $80_{42}$, respectively, through the servo circuits $81_{11}$, $81_{12}$, $81_{21}$, $81_{22}$, $81_{31}$, $81_{32}$, $81_{41}$ and $81_{42}$, respectively, to thereby apply damping forces proportional to the induced currents, respectively, to the thrust producing portions 88, respectively. By this, the vibration can be damped quickly.

In this case, if the damping force producing operation is not ceased and the damping force is applied during the exposure operation, high-frequency vibration may be transmitted. Therefore, during the exposure operation, it is preferable to stop the damping force producing operation such that the vacuum chamber 10 is supported only by the coiled springs $50_1$–$50_3$.

In order to prohibit the damping force producing operation during the exposure operation, the device may be equipped with discriminating means for discriminating the completion of vibration damping of the supported member, and a blocking mechanism for blocking the thrust producing mechanisms and the damping force producing mechanisms after completion of the vibration damping of the supported member.

More specifically, by way of an example, the damping completion discriminating means may comprise an adder (not shown) for adding the output signals of the amplifiers $82_{11}$, $82_{12}$, $82_{21}$, $82_{22}$, $82_{31}$, $82_{32}$, $82_{41}$ and $82_{42}$ of FIG. 10 and a comparator (not shown) for comparing the magnitude of an output signal of the adder with a predetermined reference level. On the other hand, the blocking mechanism may comprise switches (not shown) each being disposed between a corresponding one of the current amplifiers $80_{11}$, $80_{12}$, $80_{21}$, $80_{22}$, $80_{31}$, $80_{32}$, $80_{41}$ and $80_{42}$ and a corresponding one of the coils $87_{11}$, $87_{12}$, $87_{21}$, $87_{22}$, $87_{31}$, $87_{32}$, $87_{41}$ and $87_{42}$, and each being on/off controlled in response to an output signal of the comparator. Each switch may be turned off when the magnitude of the output signal of the adder becomes larger than the reference level and, by such control, it is possible to prevent transmission of high-frequency vibration.

With this attitude control device, as described, the attitude of the stage frame 26 can be held constant when the stage 20 or the Y-axis stage 22 (FIG. 5) moves. This naturally means that also the position of the stage frame 26 can be held constant. However, since no feedback control is provided with respect to the position, actually there is a possibility of positional displacement in the Y-axis direction illustrated. In consideration of this possibility, after the above-described attitude control operation is fully completed, the CPU 70 may detect the output signal of the supporting reference plane displacement detecting sensor 32 to detect any positional displacement of the supporting reference plane 30 and, then, it may actuate the hydraulic cylinders $40_1$, $40_2$ and $40_3$ while monitoring the output signals of the displacement sensors $41_1$, $41_2$ and $41_3$ to displace the supporting reference plate 30 as a whole along the Y-axis direction to thereby maintain the position of the stage frame 26 constant. If on that occasion the coiled springs $50_1$–$50_3$ vibrate, the above-described damping force producing mechanisms may be operated or the above-described damping completion discriminating means and the above-described blocking mechanisms may be operated. Further, if only the attitude control of the X-ray exposure apparatus is desired, in addition to the output signal of the supporting reference plate displacement detecting sensor 32, an X-ray detector such as a tungsten wire may be used to monitor a relative positional deviation with respect to the X-rays (synchrotron radiation light), to provide a feedback control system for correction of the positional deviation.

Figure 12:
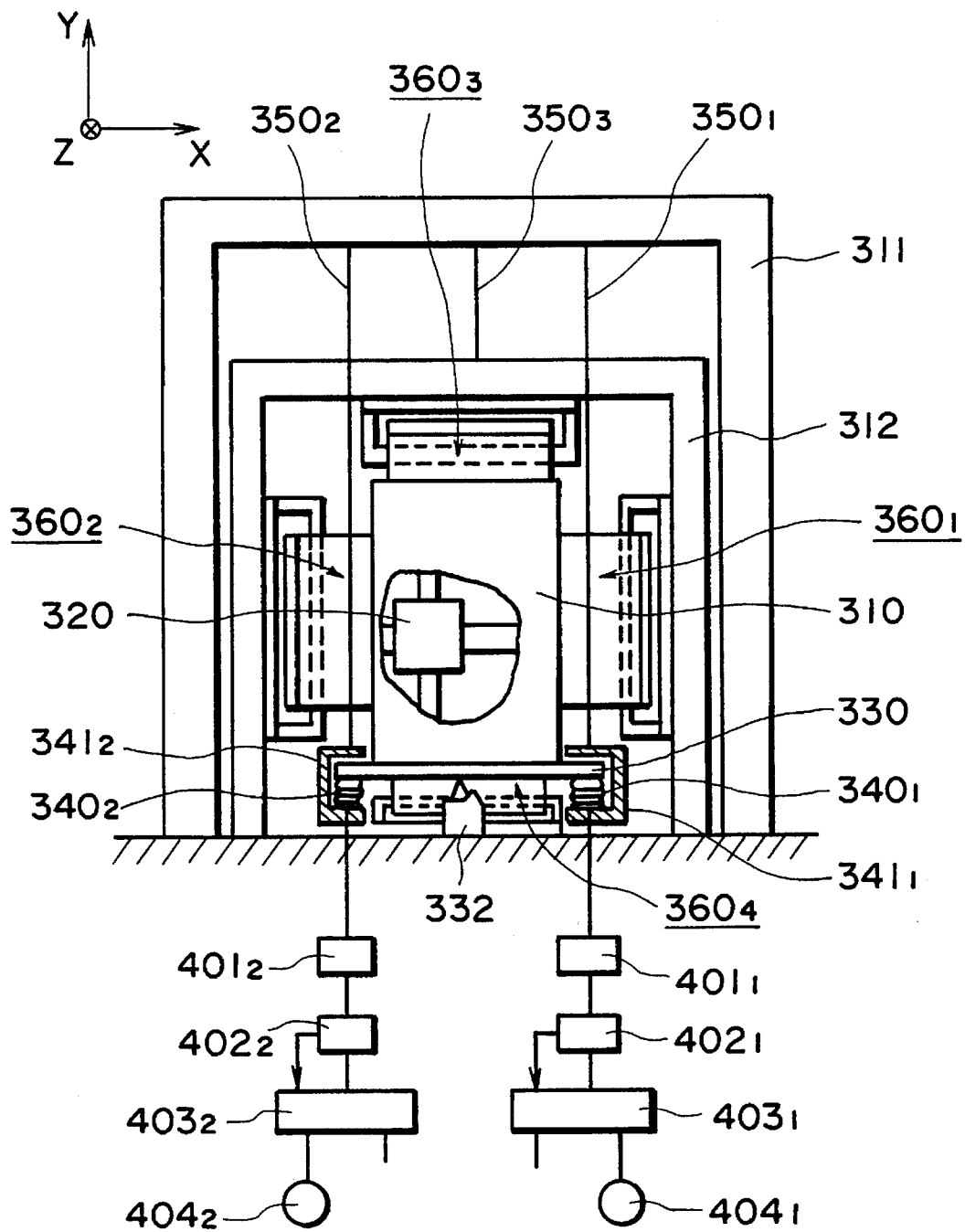
FIG. 12 is a schematic view of an attitude control device for an X-ray exposure apparatus, and shows a supporting device according to a fourth embodiment of the present invention.

FIG. 12 is a schematic view of an attitude control device for an X-ray exposure apparatus, and shows an attitude control device according to a fourth embodiment of the present invention.

This attitude control device differs from that shown in FIG. 4 in the following points:

(a) The driving mechanism includes low-rigidity supporting means comprising a suspending wire and an air spring, and high-rigidity displacement producing means comprising an air spring, a valve and a pump.

(b) Displacement detecting means for the high-rigidity displacement producing means comprises a mass-flow-meter with an integrating circuit.

(c) The control mechanism includes supporting force predicting means having a pressure sensor.

Figure 13:
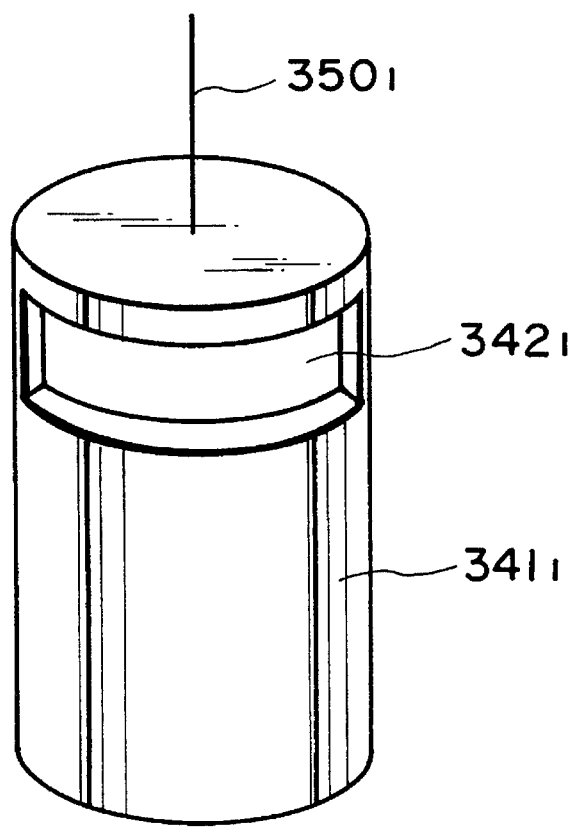
FIG. 13 is an appearance view showing the structure of an air spring housing of FIG. 12.

More specifically, a first driving mechanism includes a suspending wire $350_1$ having an end fixed to a main frame 311 and another end fixed to the top surface of an air spring housing $341_1$, and an air spring $340_1$ having a bottom face fixed to an inside bottom surface of the air spring housing $341_1$ and a top face fixed to a lower surface at an end of a supporting reference plate 330, extending through an opening $342_1$ (FIG. 13) of the air spring housing $341_1$. A second driving mechanism and a third driving mechanism each has a similar structure.

The air spring $340_1$ is connected to a pump $404_1$ through a pressure sensor $401_1$, a mass-flow meter $402_1$ with an integrated circuit, and a valve $403_1$. The remaining two air springs $340_2$ and $340_3$ (now shown) each has a similar structure.

The operation of this attitude control device is essentially the same as that of the attitude control device of FIG. 4. However, there is a difference with respect to the static force balancing operation and the correcting operation for correcting a positional deviation of the stage frame (not shown). Thus, these two operations will now be explained.

(a) Static Force Balancing Operation:

Also in this attitude control device, the static force balancing as the stage 320 or the Y-axis stage (not shown) moves can be attained by applying forces P1, P2 and P3 expressed by equations (7)–(8) to the air springs $340_1$, $340_2$ and $340_3$, respectively. Here, the forces "P1$mo$+P1$no$", "P2$mo$+P2$no$" and "P3$mo$+P3$no$" in the right sides of equations (7)–(8) can be determined On the basis of the output signals of the pressure sensors $401_1$, $401_2$ and $401_3$ (pressure sensor $401_3$ is not shown) produced before movement of the stage 320 or the Y-axis stage.

Assuming now that the attitude control device as a whole is placed in a temperature controlled room, to the operative gas of the air springs $340_1$–$340_3$, an equation of state of an ideal gas such as follows apply:

$$P \cdot V = n \cdot R \cdot T \tag{27}$$

From equation (27), it is seen that only the pressure can be changed through $\Delta P$ by changing the mole, number by $\Delta n$, expressed as follows:

$$\Delta n = \Delta P \cdot V/(R \cdot T) \tag{28}$$

Therefore, if each of the air springs $340_1$–$340_3$ has a sectional area S, then gases of mole numbers $\Delta n1$, $\Delta n2$ and $\Delta n3$, to be-expressed below, may be supplied to the air springs $340_1$–$340_3$, respectively, from the pumps $404_1$–$404_3$, respectively.

$$\Delta n1 = \{P1m + P1n - (P1mo + P1no)\} \cdot V/(S \cdot R \cdot T) \tag{29}$$

$$\Delta n2 = \{P2m + P2n - (P2mo + P2no)\} \cdot V/(S \cdot R + T) \tag{30}$$

$$\Delta n3 = \{P3m + P3n - (P3mo + P3no)\} \cdot V/(S \cdot R \cdot T) \tag{31}$$

In this attitude control device, by using a CPU (not shown), the mole numbers $\Delta n1$, $\Delta n2$ and $\Delta n3$ represented by equations (7)–(8) are predicted and gases of these mole-numbers $\Delta n1$, $\Delta n2$ and $\Delta n3$ are supplied to the air springs $340_1$–$340_3$, respectively, from the pumps $404_1$–$404_3$, respectively. Here, the mass flow rate of each gas is integrated with respect to time by means of a corresponding one of the mass-flow meters $402_1$–$402_3$ having integrated circuits. The obtained result of integration with respect to time is multiplied by a predetermined coefficient (corresponding to $1/(R \cdot T)$) to determine an actual change in a corresponding mole number, and the opening of a corresponding one of the valves $403_1$–$403_3$ is controlled in accordance with the change in the mole number.

(b) Positional Deviation Correcting Operation:

After the attitude control of the stage frame, a supporting reference plate displacement detecting sensor 332 is used to detect a positional deviation of the supporting reference plate 330 in the Y-axis direction illustrated. If a positional deviation of ΔY is detected, then gases of mole numbers Δn1a, Δn2a and Δn3a to be expressed below are supplied to the air springs $340_1$–$340_3$, respectively, from the pumps $404_1$–$404_3$, respectively.

$$\Delta n1a = P1 \cdot \Delta Y/(R \cdot T) \tag{32}$$

$$\Delta n2a = P2 \cdot \Delta Y/(R \cdot T) \tag{33}$$

$$\Delta n3a = P3 \cdot \Delta Y/(R \cdot T) \tag{34}$$

Here, the mass flow rate of each gas is integrated with respect to time by means of a corresponding one of the mass-flow meters $402_1$–$402_3$ having integrated circuits. The obtained result of integration with respect to time is multiplied by a predetermined coefficient (corresponding to 1/(R·T)) to determine an actual change in a corresponding mole number, and the opening of a corresponding one, of the valves $403_1$–$403_3$ is controlled in accordance with the change in the mole number.

Figure 14:
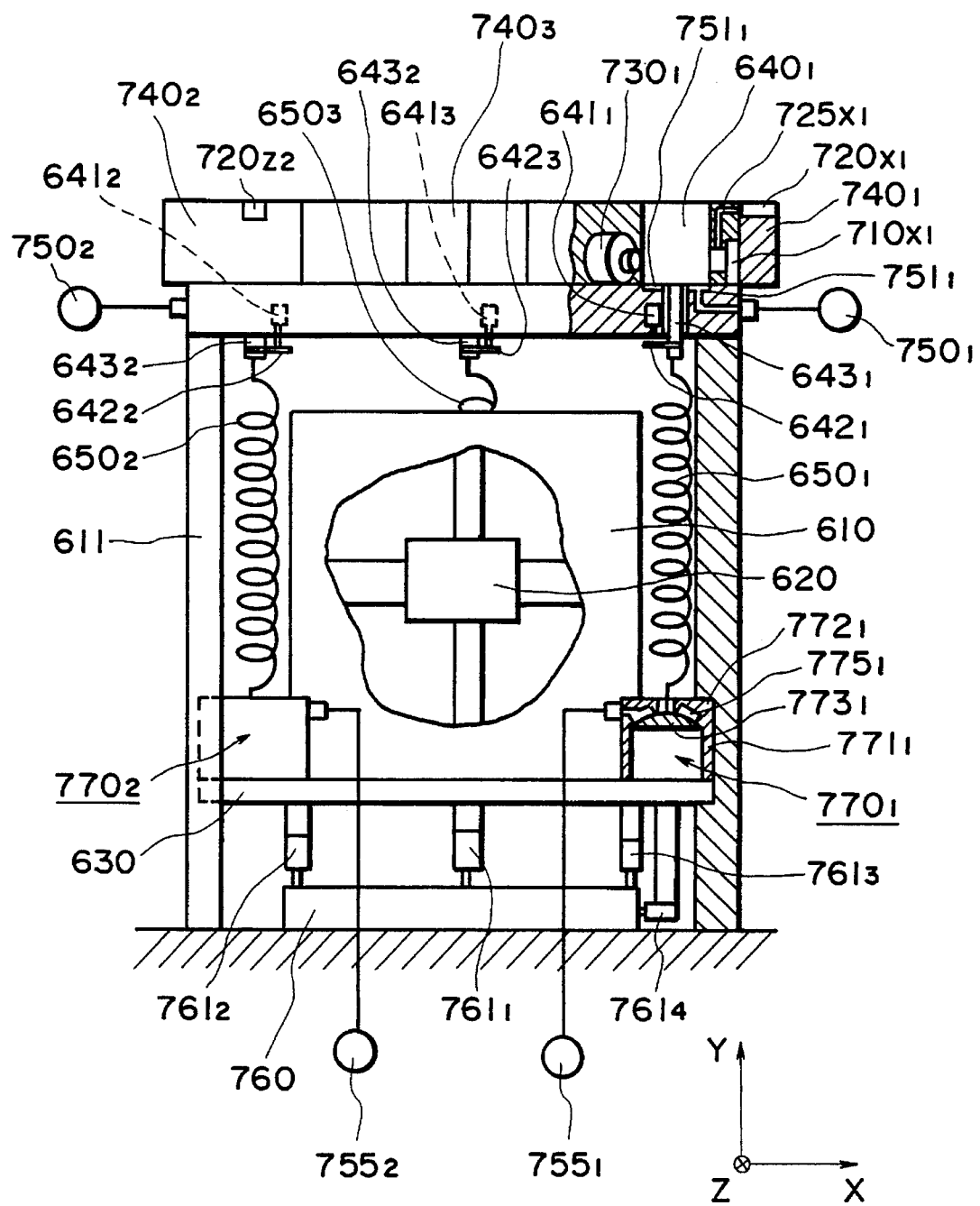
FIG. 14 is a schematic view of an attitude control device for an X-ray exposure apparatus, and shows a supporting device according to a fifth embodiment of the present invention.

FIG. 14 is a schematic view of an attitude control device for an X-ray exposure apparatus, and shows an attitude control device according to a fifth embodiment of the present invention.

This attitude control device differs from that shown in FIG. 1 in that: it includes moving means for moving three high-rigidity displacement producing means of three sets of driving mechanisms, each in a plane perpendicular to the direction along which the displacement is produced by that displacement producing means; and it includes coupling means for rotatably mounting to a supporting reference plate three low-rigidity supporting means of the three sets of driving mechanisms.

Details of the moving means and the coupling means will be explained below.

Figure 15:
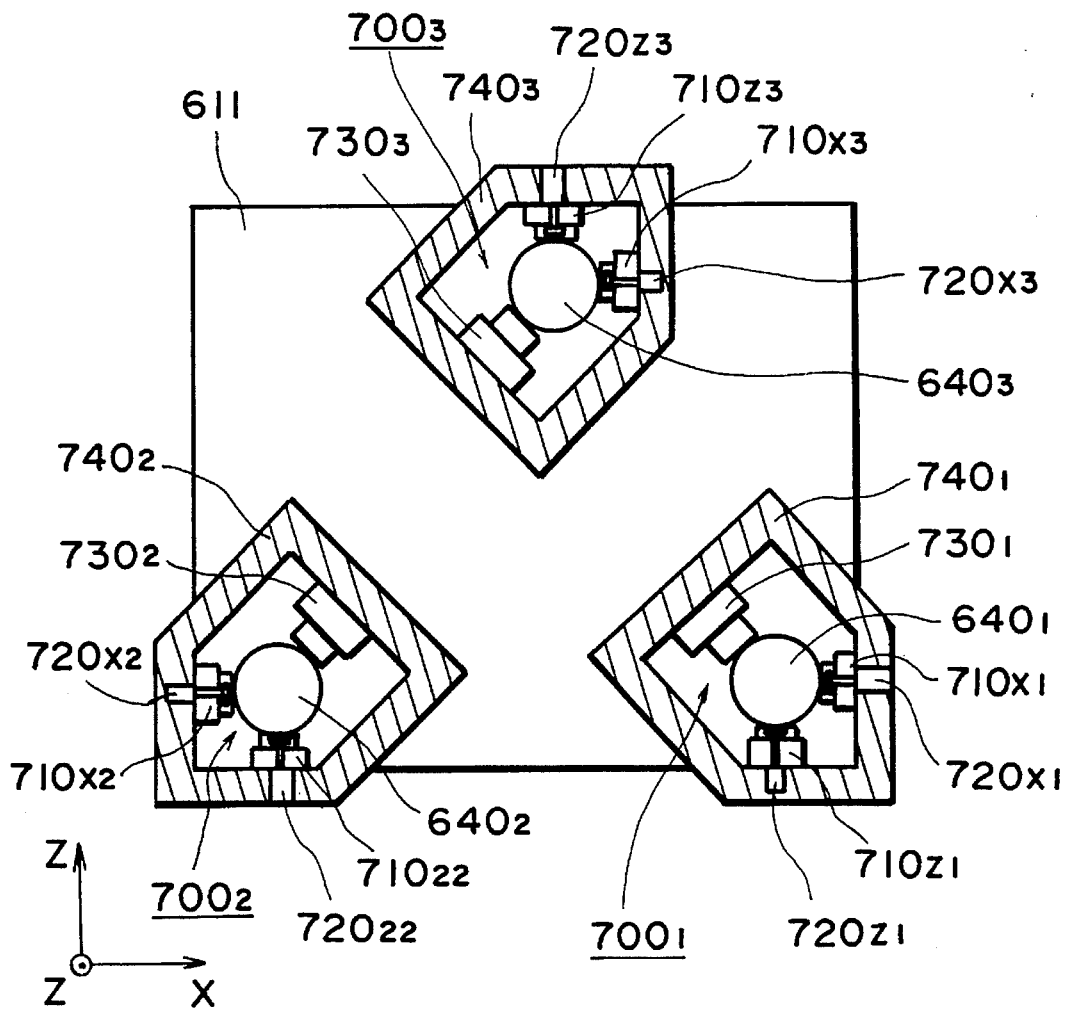
FIG. 15 is a schematic view showing the structure of moving devices.

(a) Moving Means:

As shown in FIG. 15, hydraulic cylinders $640_1$, $640_2$ and $640_3$ each of a cylindrical shape and each constituting a high-rigidity displacement producing means, are mounted into moving devices $700_1$, $700_2$ and $700_3$, respectively, each serving as the moving means and each provided on the upper surface of a top plate of a main frame 611. The hydraulic cylinders $640_1$, $640_2$ and $640_3$ have their rods $643_1$, $643_2$ and $643_3$ extended through bores, respectively, formed in the top plate of the main frame 611.

Here, the first moving device $700_1$ comprises: an X-Z displacement frame $740_1$; moving hydraulic cylinders $710_{X1}$ and $710_{Z1}$ mounted to an inside wall surface of the X-Z displacement frame $740_1$, for moving the hydraulic cylinder $640_1$ in the X-axis direction and the Z-axis direction, respectively; a positioning pressurizing mechanism $730_1$ mounted to the inside wall surface of the X-Z displacement frame $740_1$, for urging the hydraulic cylinder $640_1$ obliquely, in a rightward and downward direction as viewed in the drawing; and displacement detecting sensors $720_{X1}$ and $720_{Z1}$ embedded in the X-Z displacement frame $740_1$, for detecting the amount of displacement of the hydraulic cylinder $640_1$ in the X-axis direction and the Z-axis direction, respectively. More specifically, as shown in FIG. 14, the displacement sensors $720_{X1}$ and $720_{Z1}$ each serves to detect the amount of displacement of a corresponding one of the moving hydraulic cylinders $710_{X1}$ and $710_{Z1}$ through a corresponding one of displacement detection reference plates $725_{X1}$ and $725_{Z1}$ (only the reference plate $725_{X1}$ is shown in FIG. 14) mounted to the rods of the moving hydraulic cylinders $710_{X1}$ and $710_{Z1}$, respectively. It is to be noted that the surfaces of the hydraulic cylinder $640_1$ urged by the moving hydraulic cylinders $710_{X1}$ and $710_{Z1}$ and the positioning pressurizing mechanism, respectively, are flat.

Provided in a portion of the top plate of the main frame 611 to which the hydraulic cylinder $640_1$ contacts, is a pneumatic pressure producing groove $751_1$ which communicates with a pump 750. By supplying a high-pressure gas to the pneumatic pressure producing groove $751_1$ from the pump 750, the hydraulic cylinder $640_1$ can be floated slightly such that it can be moved in the X-axis direction or in the Z-axis direction without friction with the top plate.

The second moving device $700_{21}$ and the third moving device $700_3$ shown in FIG. 15 each has a similar structure.

(b) Coupling Means:

The coupling means comprises three coupling devices $770_1$–$770_3$. Here, as shown in FIG. 14, the first coupling device $770_1$ which is one constituent element of the coupling means, comprises: a first member $771_1$ of cylindrical shape, having a bottom face fixed to the supporting reference plate 630; a second member $772_1$ having a bottom faces an outer circumferential portion of which is fixed to the upper surface of the first member $771_1$ and a central portion of which defines a portion of a spherical surface (spherical plane about a point on the upper surface of the supporting reference plate 630), wherein the second member has a throughbore formed in a central portion thereof for receiving an end of the coiled spring $650_1$; and a third member $773_1$ having an upper surface contacting the central portion of the bottom face of the second member $772_1$, wherein the end of the coiled spring $650_1$ is attached to the center of the upper surface of the third member. Further, a groove $775_1$ communicated with a pump $755_1$ is formed in the bottom face of the second member $772_1$. By supplying a high-pressure gas to the groove $775_1$ from the pump $755_1$, the upper surface of the third member $773_1$ and the bottom face of the second member $772_1$ are brought into contact with each other with the intervention of an air film (not shown) therebetween, such that the first coupling means $770_1$ functions like a universal joint allowing substantially friction-free rotation about the X axis, the Y axis and the Z axis in the drawing.

The second coupling device $770_2$ and the third coupling device $770_3$ each has a similar structure.

Figure 16:
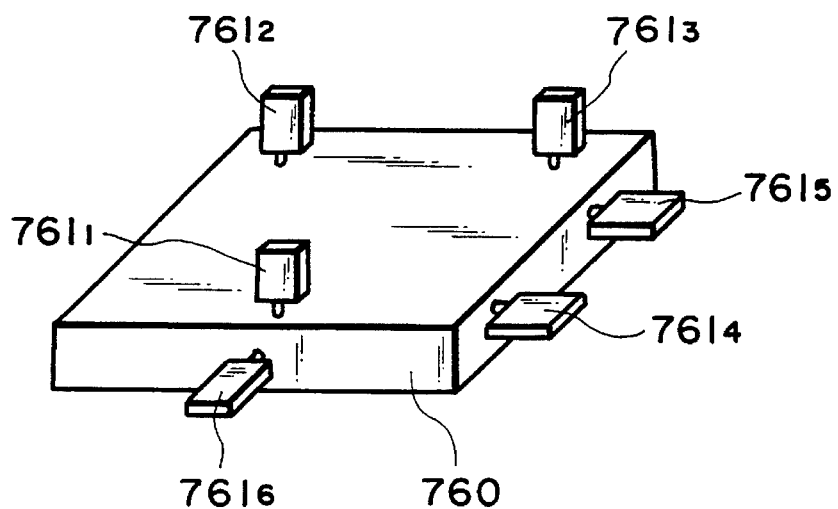
FIG. 16 is a schematic view showing the positional relationship of a displacement detection reference plate and displacement sensors.

This attitude control device uses supporting reference plate displacement detecting means which comprises a displacement detection reference plate 760 and six displacement detecting sensors $761_1$–$761_6$ shown in FIG. 16, in place of the supporting reference plate displacement sensor 532 shown in FIG. 1.

Here, the displacement detection reference plate 760 comprises a cubic member having high-precision flatness and high-precision orthogonality, and it is placed on the ground as shown in FIG. 14.

The three displacement sensors $761_1$–$761_3$ are provided between the displacement detection reference plate 760 and the supporting reference plate 630, in the manner that their free ends contact the upper surface of the displacement detection reference plate 760 at a front and middle portion thereof, at a rear and left-hand side portion thereof and at a rear and right-hand side portion thereof, respectively, so as to detect displacement of the supporting reference plate 630 in the Y-axis direction in the drawing. Further, two displacement detecting sensors $761_4$ and $761_5$ (FIG. 16) are provided between the displacement detection reference plate 760 and the supporting reference plate 630 in the manner that their free ends contact the right-hand side face of the displacement detection reference plate 760, as viewed in FIG. 14, at a front portion thereof and at a rear portion thereof in the drawing, so as to detect displacement of the supporting reference plate 630 in the X-axis direction. Addition, a displacement detecting sensor 761₆ (FIG. 16) is provided between the displacement detection reference plate 760 and the supporting reference plate 630 in the manner that its free end contacts the side face of the displacement detection reference plate 760 at a front side portion thereof as viewed in FIG. 14, so as to detect displacement of the supporting reference plate 630 in the Z-axis direction.

These sensors 761₁–761₆ are secured to the bottom face of the supporting reference plate 630 through respective supporting plates.

The static force balancing operation in this attitude control device as the stage 620 or the Y-axis stage (not shown) moves is similar to that in the attitude control device of FIG. 1. Therefore, description will be made of the attitude control operation to be made through the moving means, the coupling means and the supporting reference plate displacement detecting means when a shift of exposure optical axis, for example, occurs.

If the coordinates of the target points, after the attitude control, for the points Q1, Q2 and Q3 whereat the coiled springs 650₁–650₃ are attached to the respective coupling devices 770₁–770₃, are denoted by $Q1(X_{Q1}, Y_{Q1}, Z_{Q1})$, $Q2(X_{Q2}, Y_{Q2}, Z_{Q2})$ and $Q3(X_{Q3}, Y_{Q3}, Z_{Q3})$, respectively, then, since there are nine variables $(X_{Q1}, Y_{Q1}, Z_{Q1}, X_{Q2}, Y_{Q2}, Z_{Q2}, X_{Q3}, Y_{Q3}$ and $Z_{Q3})$ to be determined, nine constraint equations are necessary to determine them.

Thus, while taking the coordinates of the movable member before the movement as the coordinates of the point Q1, the variables are determined in accordance with six constraint equations (35)–(40) to be expressed below.

Since the distances between the points Q1, Q2 and Q3 are unchangeable, the following conditions apply:

the distance between the points $Q1$ and $Q2$=const.  (35)

the distance between the points $Q2$ and $Q3$=const.  (36)

the distance between the points $Q3$ and $Q1$=const.  (37)

Also, with regard to a vector $A_1$ connecting the points Q1 and Q2, a vector $A_2$ connecting the points Q2 and Q3 and a vector B of normal to a plane containing the points Q1, Q2 and Q3, the following conditions apply:

the inner product of $A_1$ and $B$=0  (38)

the inner product of $A_2$ and $B$=0  (39)

If the vector of normal to the side face of the displacement detection reference plate 760 is C, then, since the angle θ defined between the vector $A_2$ and the normal vector C can be detected by calculation, the following condition applies:

the inner product of $A_2$ and $C=|A_2|\cdot|C|\cdot\cos \theta$ (=const.)  (40)

The target points can be determined from the foregoing, and the current coordinates of the points Q1, Q2 and Q3 are determined in accordance with the output signals of the displacement sensors 761₁–761₆. Therefore, by actuating the hydraulic cylinders 640₁–640₃ as well as the moving cylinders 710ₓ₁, 710_{Z1}, 710_{X2}, 710_{Z2}, 710_{X3} and 710_{Z3}, it is possible to adjust the position of the vacuum chamber into alignment with the exposure optical axis.

Figure 17:
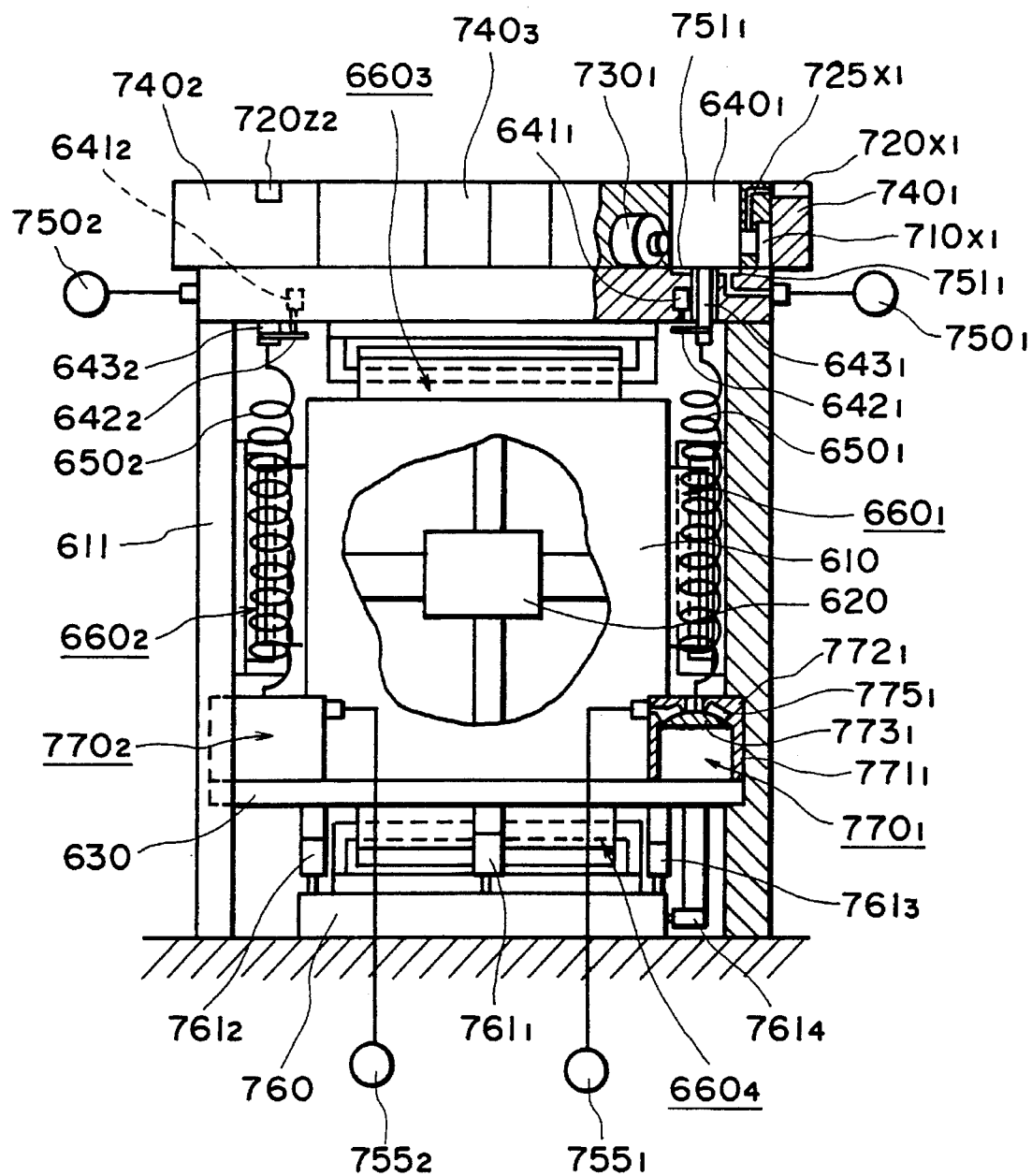
FIG. 17 is a schematic view of the attitude control device of FIG. 14 when equipped with four linear motors.

It is to be noted that, as shown in FIG. 17, four linear motors 660₁–660₄ may be provided between the vacuum chamber 610 and the main frame 611, to thereby assure the same function (attitude control against a dynamic force resulting from movement of the movable member) as that of the attitude control device shown in FIG. 4.

While in this attitude control device the fixed members of the linear motors (FIG. 6) are fixed to the main frame 611, if the rigidity of the main frame is low, a subsidiary frame may be provided as in the attitude control device of FIG. 4 and the fixed members may be fixed to such a subsidiary frame.

Figure 18:
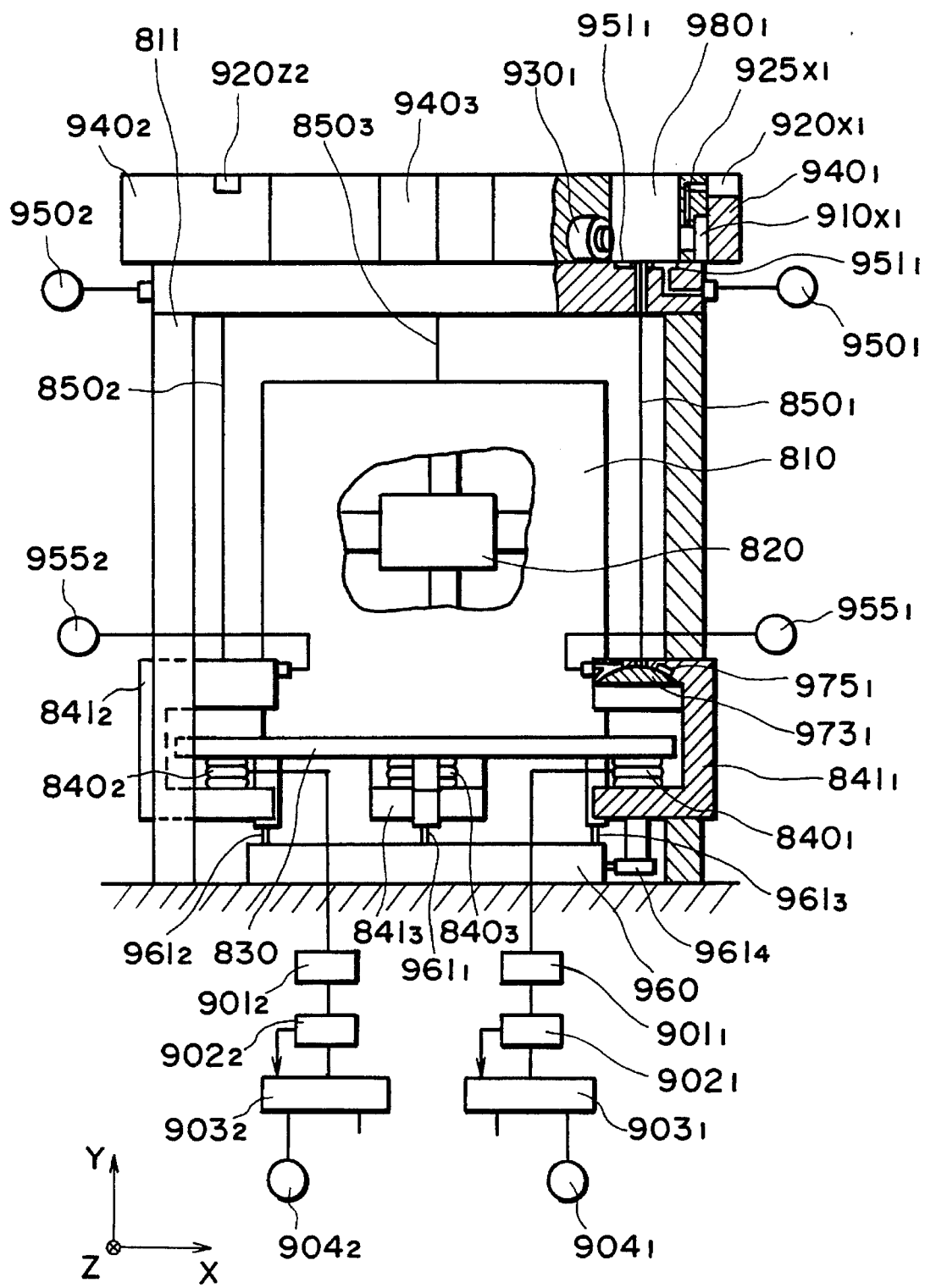
FIG. 18 is a schematic view of an attitude control device for an X-ray exposure apparatus, and shows a supporting device according to a sixth embodiment of the present invention.

FIG. 18 is a schematic view of an attitude control device for an X-ray exposure apparatus, and shows an attitude control device according to a sixth embodiment of the present invention.

This attitude control device corresponds to a form wherein, to the attitude control device of FIG. 12, moving means for moving three high-rigidity displacement producing means of three sets of driving mechanisms each in a plane perpendicular to a direction along which displacement is produced by that displacement producing means, as well as coupling means for mounting three low-rigidity supporting means of the three sets of driving mechanisms to a supporting reference plate, are added. Four linear motors are not used, and the supporting reference plate displacement sensor 332 is replaced by supporting reference plate displacement detecting means (FIG. 16) comprising a displacement detection reference plate 960 and six displacement detecting sensors 961₁–961₆ (sensors 961₅ and 961₆ are not shown).

The moving means differs from that shown in FIG. 15 in that, in place of the three hydraulic cylinders 640₁–640₃, it is equipped with suspension references 980₁–980₃ (suspension references 980₂ and 980₃ are not shown) to which the ends of the three suspending wires 850₁–850₃ are fixed, respectively.

Further, the device differs from that of FIG. 14 in that air springs 840₁–840₃ each functions as the coupling means. More specifically, an air spring housing 840₁ has a top plate, the central portion of the bottom face of which defines a portion of a spherical surface (spherical plane about a point on the upper surface of the supporting reference plate 830), and it has a throughbore formed in the central portion for receiving an end of the suspending wire 850₁. Further, the upper surface of the third member 973₁ contacts the central portion of the bottom face of the top plate of the air spring housing 840₁, and the end of the suspending wire 850₁ is attached to the center of this upper surface. Provided in the bottom face of the top plate of the air spring housing 840₁ is a groove 975₁ which communicates with a pump 955₁. By supplying a high-pressure gas to the groove 975₁ from the pump 955₁, the upper surface of the third member 973₁ and the bottom face of the top plate are brought into contact with each other with the intervention of an air film (not shown), to thereby assure that the air spring housing 840₁ serves as a universal joint allowing substantially friction-free rotation about the X axis, the Y axis and the Z axis in the drawing. This is also the case with the remaining two air spring housings 840₂ and 840₃.

Also in this attitude control device, four linear motors may be provided between the vacuum chamber 810 and the main frame 811, so as to provide the same function (attitude control against a dynamic force resulting from movement of a movable portion) as of the attitude control device of FIG. 4.

Next, another example of a linear motor structure operable as a thrust producing mechanism and a damping force producing mechanism, will be explained.

Figure 19A:
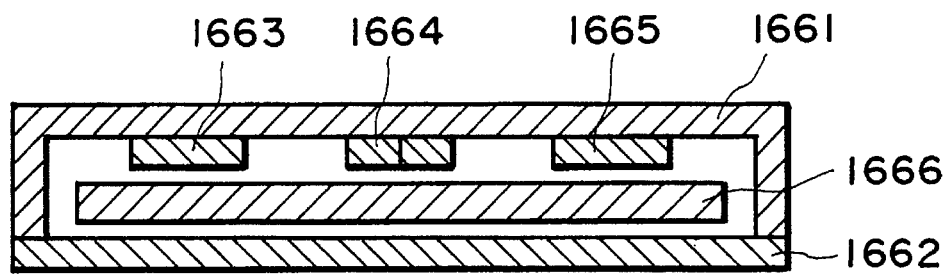
Figure 19B:
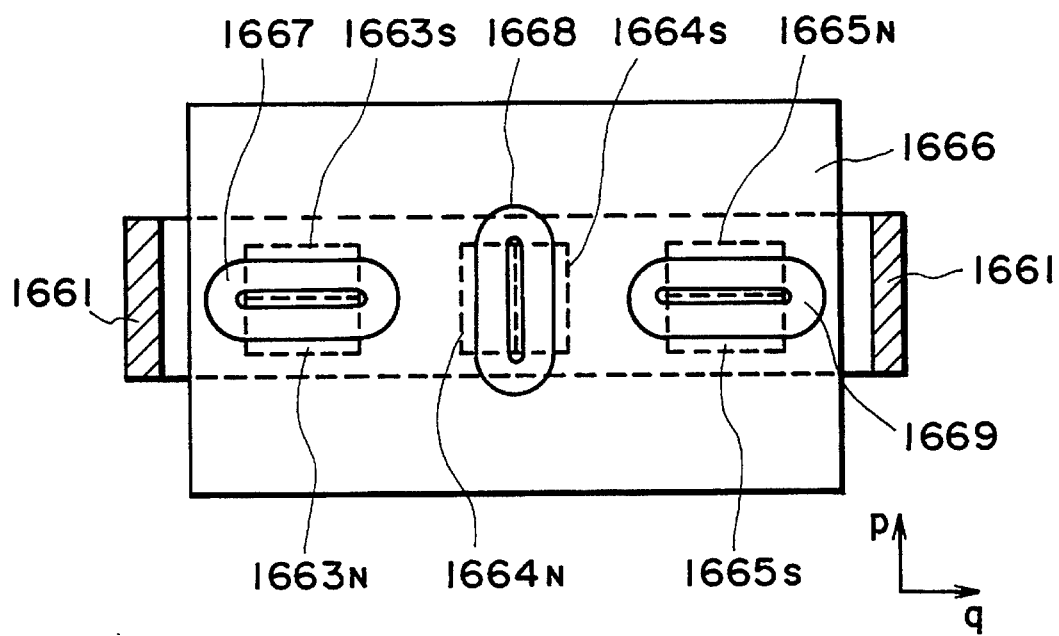

The linear motor shown in FIGS. 19A and 19B differs from those shown in FIGS. 6 and 7 in that three permanent magnets 1663, 1664 and 1665 are mounted along a longitudinal center line of a surface of a fixed member 1661 opposed to a fixed member 1662.

As shown in FIGS. 19A and 19B, in this linear motor, the permanent magnet 1663 which is mounted to the opposed surface of the second fixed member 1661 at a left-hand side portion thereof as viewed in FIG. 19A, has an N-pole $1663_N$ at a front side and an S-pole $1663_S$ at a rear side as viewed in the drawing. The permanent magnet 1664 which is mounted to the opposed surface of the second fixed member 1661 at a middle portion thereof, has an N-pole $1664_N$ at a left-hand side and an S-pole $1664_S$ at a right-hand side as viewed in the drawing. Further, the permanent magnet 1665, which is mounted thereto opposes a surface of the second fixed member 1661 at a left-hand side portion thereof as viewed in the drawing, and has an S-pole $1665_S$ at a front side and an N-pole $1665_N$ at a rear side, as viewed in the drawing.

In this linear motor, by flowing the currents through the coils 1667 and 1669 in the same direction, it is possible to produce a thrust in a rotational direction within a p-q plane in FIG. 19B and, additionally, it is possible to attenuate vibration in a rotational direction within the p-q plane.

Figure 20:
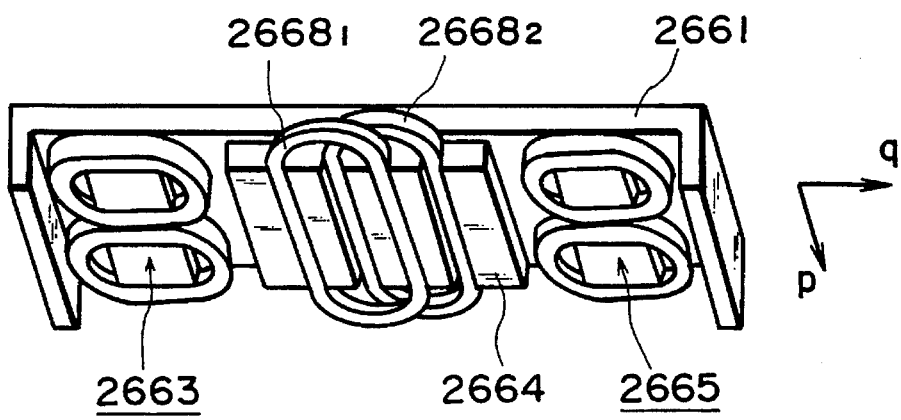
FIG. 20 is a schematic view of another example of a linear motor.
Figure 21A:
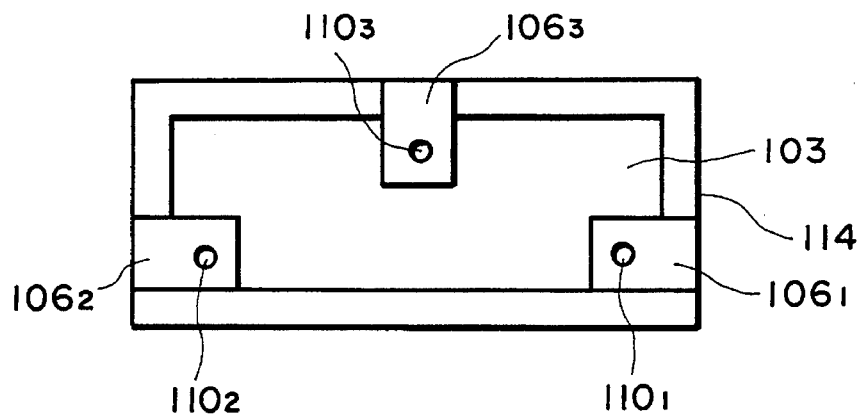
Figure 21B:
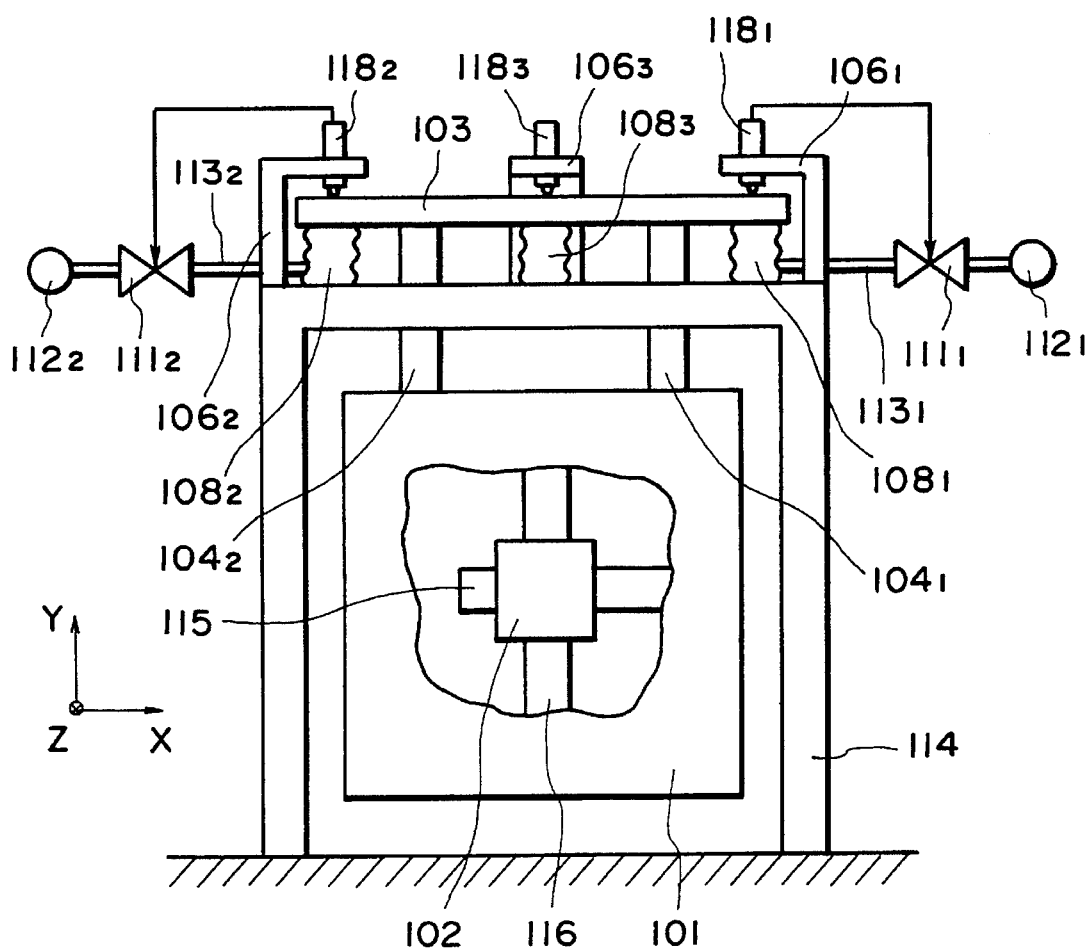
Figure 22:
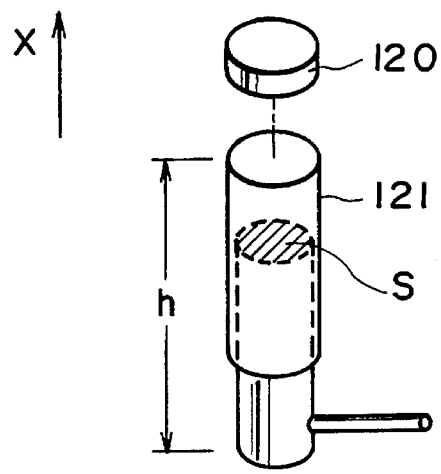
FIG. 22 is a schematic view for explaining a problem peculiar to a driving system of the attitude control device of FIGS. 21A and 21B.
Figure 23:
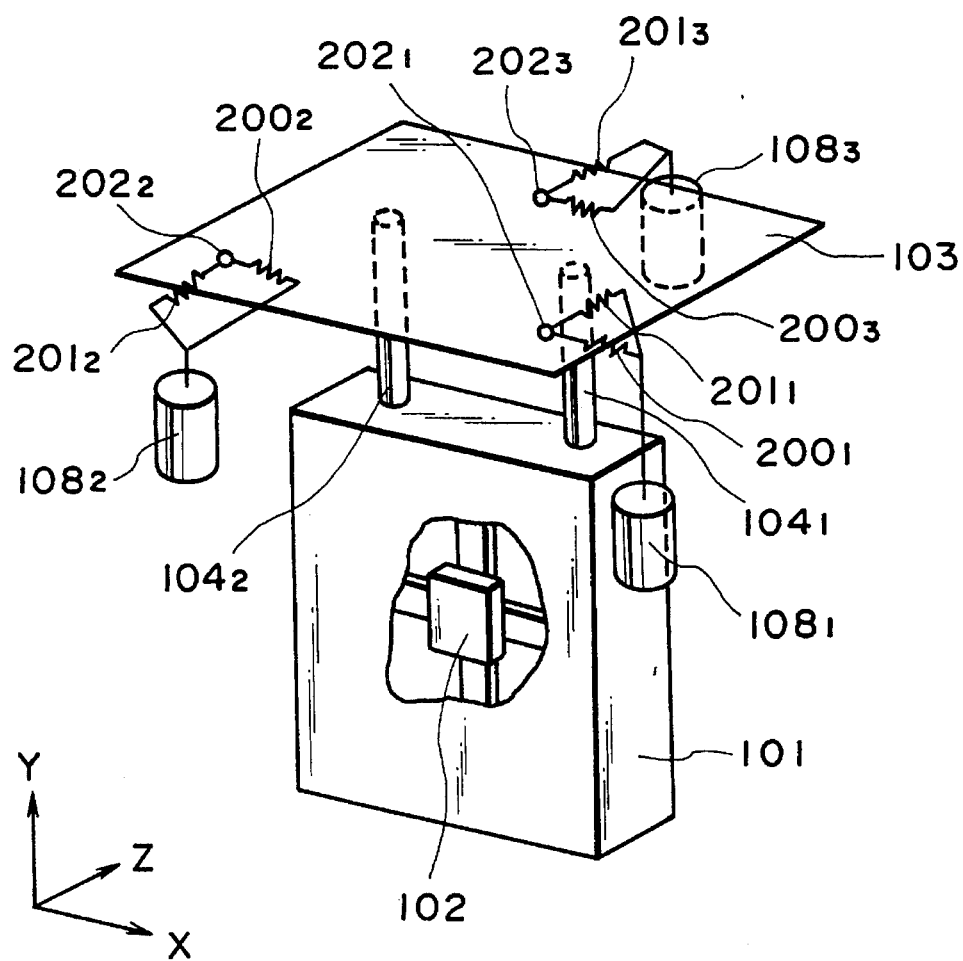
FIG. 23 is a schematic view of an approximated structure of the whole system of the attitude control device of FIGS. 21A and 21B.

The linear motor shown in FIG. 20 differs from the FIG. 19 example in that it uses the principle of an induction motor.

More specifically, at the left-hand and right-hand sides of the second fixed member as viewed in FIG. 20, dual-pole electromagnets 2663 and 2665 are mounted so as to produce a thrust and a damping force in the p-axis direction illustrated. Further, at the middle of the second fixed member 2661, a polar tooth 2664 having two coils $2668_1$ and $2668_2$ disposed in parallel to and intersecting with each other, is mounted. By applying currents having a relative phase shift of 90 deg. to these coils $2668_1$ and $2668_2$, a thrust and a damping force in the q-axis direction illustrated can be produced through cooperation with a movable member (not shown) which is made of aluminum.

Since in this linear motor the damping force is applied automatically, use of a speed sensor and a negative feedback circuit therefor is not necessary. Because of the omission of the speed sensor, it is not possible to provide a discriminating means for discriminating the completion of vibration damping. However, on an occasion when the device is used in the attitude control device of FIG. 4, for example, the displacement of the speed of the supporting reference plate 30 as detected by the supporting reference plate displacement sensor 32 may be compared with a predetermined reference level, to produce the damping completion signal.

While in the attitude control devices described hereinbefore the movement of the movable portion and the production of thrust by a thrust producing mechanism are in the same direction, they may be in different directions.

For example, in the attitude control device shown in FIG. 1, if the coordinate of the stage 520 in the movement direction is (x, y, z) having been rotated by 1 deg. about the X axis relative to the illustrated (X, Y, Z) coordinate, then, in order to assure static force balancing with the movement of the stage 520 and the Y-axis stage 521, the following equations may be used in place of equations (15) and (18) to determine the component forces P1m, P2m and P3m as well as the component forces P1n, P2n and P3n while using $\Delta X$ and $\Delta Y$ as functions:

$$(Z1mo+\Delta Z)\cdot P1m+(Z2mo+\Delta Z)\cdot P2m+(Z3mo+\Delta Z)\cdot P3m=0 \quad (15')$$

$$(Z1no+\Delta Z)\cdot P1n+(Z2no+\Delta z)\cdot P2n+(Z3no+\Delta Z)\cdot P3n=0 \quad (18')$$

wherein $\Delta Z=\Delta Y\cdot \sin 1°$.

Further, in the attitude control device of FIG. 4, for example, for dynamic force balancing or for quick vibration damping upon movement of the stage 520 or the Y-axis stage 521, similar coordinate axis conversion may be made to determine the levels of electric currents to be applied to the linear motors $60_1$–$60_4$.

In accordance with these features of the present invention, there are provided advantageous effects examples of which are as follows:

In a supporting means of the present invention, three sets of driving mechanisms each comprising high-rigidity displacement producing means and low-rigidity supporting means disposed in series with the high-rigidity displacement producing means and having a low damping factor, are disposed between a main frame and a supporting reference plate on which a member to be supported and having an inside movable portion is placed. For holding the attitude of the supported member when the movable portion moves, each low-rigidity supporting means is displaced by means of corresponding high-rigidity displacement producing means. This minimizes initial displacement of the low-rigidity supporting means and, as a result, prevents vibration of the low-rigidity supporting means.

An attitude control device of the present invention is equipped with a supporting means and a supporting force predicting means for predicting the supporting force of each low-rigidity supporting means corresponding to the gravity center position of a movable portion accommodated in the supported member. Each low-rigidity supporting means can be displaced so as to produce supporting forces as predicted by the supporting force predicting means, such that only the application of the smallest displacement necessary for the control system assures counteracting to the static force resulting from the movement of the movable portion. Therefore, it is possible to hold the attitude of the supported member very precisely.

While the invention has been described with reference to the structures disclosed herein, it is not confined to the details set forth and this application is intended to cover such modifications or changes as may come within the purposes of the improvements or the scope of the following claims.

What is claimed is:

1. A supporting system for supporting a structure having a movable portion, a gravity center position of the structure being changeable with movement of the movable portion, said system comprising:

a main frame for supporting the structure through a plurality of supporting members;

a plurality of first supporting members coupled to a top of said main frame, each of said first supporting members having a predetermined rigidity and comprising an actuator being expansible and contractable along a vertical direction; and a second supporting member for connecting the structure and the first supporting members, said second supporting member having (i) a predetermined elasticity along the vertical direction, and (ii) a rigidity less than that of said first supporting members, wherein the structure is suspended from the top of said main frame through said first and second supporting members.

2. A system according to claim 1, wherein each of said actuators of said first supporting members comprises a fluid cylinder.

3. A system according to claim 1, further comprising predicting means for predicting a supporting force of said second supporting member in accordance with the gravity center position of the structure, and for producing an output, wherein each of said actuators of said first supporting members is actuated in response to the output of said predicting means.

4. A system according to claim 3, wherein said predicting means comprises detecting means for detecting displacement of each of said first supporting members.

5. A system according to claim 1, wherein the structure comprises a stage device.

6. A system according to claim 5, wherein the stage device is movable along a vertical plane.

7. A system according to claim 5, wherein the stage device is able to support a workpiece to be exposed with radiation.

8. A system according to claim 1, further comprising actuating means for providing a thrust force in the vertical direction to reduce a reaction generated when the movable portion of the structure moves.

9. A system according to claim 8, further comprising predicting means for predicting the reaction to which said actuating means is responsive.

10. A system according to claim 9, further comprising means for providing a damping force to the structure having the movable portion.

11. A system according to claim 1, further comprising means for moving a respective actuator of said plurality of first supporting members in a direction substantially perpendicular to the vertical direction.

12. A system according to claim 11, further comprising means for rotatably coupling said second supporting member to the structure.

13. A system according to claim 1, wherein there are three first supporting members.

14. A method of supporting a structure having a movable portion, said method comprising the steps of:

providing a main frame for supporting the structure through a plurality of supporting members, wherein the supporting members comprise (i) a plurality of first supporting members coupled to a top of the main frame, each first supporting member having a predetermined rigidity and having an actuator being expansible and countractable along a vertical direction, and (ii) a second supporting member for connecting the structure and the first supporting members, the second supporting member having a predetermined elasticity along the vertical direction and a rigidity less than that of the first supporting members;

suspending the structure from the top of the main frame through the first and second supporting members; and moving the movable portion of the structure, wherein a gravity center position of the structure is changeable with the movement of the movable portion.

* * * * *

UNITED STATES PATENT AND TRADEMARK OFFICE
CERTIFICATE OF CORRECTION

PATENT NO. : 5,467,720
DATED : November 21, 1995
INVENTOR(S) : NOBUSHIGE KORENAGA, ET AL.

It is certified that error appears in the above-indentified patent and that said Letters Patent is hereby corrected as shown below:

ON THE COVER PAGE:

Under "Foreign Application Priority Data":

"Feb. 25, 1991 [JP] Japan ...... 2-050102" should read --Feb. 25, 1991 [JP] Japan ...... 3-050102--.

Under "U.S. PATENT DOCUMENTS":

"5,338,358 7/1993 Sakino .... 108/20" should be deleted.

Under "FOREIGN PATENT DOCUMENTS":

"3200815 2/1987 Germany" should read --3200815 7/1983 Germany--; and

"2100311 4/1990 Japan" should read --2-100311 4/1990 Japan--.

COLUMN 1:

Line 21, "No. b2-100311)." should read --No. 2-100311).--.

COLUMN 2:

Line 51, "$Q=k.T$" should read --$Q=-k \cdot T$--.

UNITED STATES PATENT AND TRADEMARK OFFICE
CERTIFICATE OF CORRECTION

PATENT NO. : 5,467,720

DATED : November 21, 1995

INVENTOR(S) : NOBUSHIGE KORENAGA, ET AL.

It is certified that error appears in the above-indentified patent and that said Letters Patent is hereby corrected as shown below:

COLUMN 4:

Line 27, "Supporting" should read --supporting--.

COLUMN 5:

Line 31, "coil," should read --coil.--.

COLUMN 6:

Line 53, "know" should read --known--.

COLUMN 7:

Line 61, "(it)" should read --(ii)--.

COLUMN 8:

Line 13, "$540_1$-$5450_3$," should read --$540_1$-$540_3$,--.

COLUMN 9:

Line 66, "P2 m+P2n" should read --P2m+P2n--.

COLUMN 16:

Line 23, "On" should read --on--;

Line 29, "apply:" should read --applies:--;

Line 34, "mole," should read --mole--; and

UNITED STATES PATENT AND TRADEMARK OFFICE
CERTIFICATE OF CORRECTION

PATENT NO.   : 5,467,720
DATED        : November 21, 1995
INVENTOR(S)  : NOBUSHIGE KORENAGA, ET AL.

It is certified that error appears in the above-indentified patent and that said Letters Patent is hereby corrected as shown below:

Line 41, "be-expressed" should read --be expressed--.

COLUMN 17:

Line 18, "one,of" should read --one of--.

COLUMN 18:

Line 12, "Structure." should read --structure.--.

COLUMN 19:

Line 1, "Addition," should read --Additionally,--; and

Line 55, "the-current" should read --the current--.

COLUMN 24:

Line 13, "countractable" should read --contractible--.

Signed and Sealed this

Seventh Day of May, 1996

Attest:

BRUCE LEHMAN

Attesting Officer     Commissioner of Patents and Trademarks